(12) United States Patent
Lee

(10) Patent No.: US 11,824,066 B2
(45) Date of Patent: Nov. 21, 2023

(54) DISPLAY DEVICE AND MANUFACTURING METHOD THEREOF

(71) Applicant: Samsung Display Co., LTD., Yongin-si (KR)

(72) Inventor: Hyeon Bum Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 104 days.

(21) Appl. No.: 17/138,018

(22) Filed: Dec. 30, 2020

(65) Prior Publication Data
US 2021/0358976 A1   Nov. 18, 2021

(30) Foreign Application Priority Data

May 14, 2020   (KR) .................. 10-2020-0057711

(51) Int. Cl.
*H01L 27/12*   (2006.01)
*G06F 3/041*   (2006.01)

(52) U.S. Cl.
CPC ........ *H01L 27/1248* (2013.01); *G06F 3/0412* (2013.01)

(58) Field of Classification Search
CPC . G06F 3/0412; H01L 27/1248; H01L 27/322; H01L 27/3246; H01L 27/3248; H01L 27/3258
See application file for complete search history.

(56) References Cited

U.S. PATENT DOCUMENTS

| | | | |
|---|---|---|---|
| 7,227,306 B2 | 6/2007 | Park et al. | |
| 2003/0202133 A1* | 10/2003 | Yun | G02F 1/133784 349/43 |
| 2016/0013260 A1* | 1/2016 | Ahn | H01L 27/3272 438/34 |
| 2017/0062528 A1* | 3/2017 | Aoyama | H01L 51/5284 |
| 2018/0053815 A1 | 2/2018 | Lee et al. | |
| 2018/0181240 A1* | 6/2018 | Heo | H01L 51/5284 |
| 2019/0302551 A1* | 10/2019 | Cao | G02F 1/136227 |

FOREIGN PATENT DOCUMENTS

| | | |
|---|---|---|
| JP | 5178006 | 4/2013 |
| KR | 10-0615199 | 8/2006 |
| KR | 10-0752385 | 8/2007 |

* cited by examiner

*Primary Examiner* — Robin J Mishler
(74) *Attorney, Agent, or Firm* — KILE PARK REED & HOUTTEMAN PLLC

(57) ABSTRACT

A display device may include a source electrode disposed on a substrate; a drain electrode disposed on the substrate; an insulating layer disposed on the source electrode and the drain electrode, the insulating layer including an opening overlapping the drain electrode; and a first electrode disposed on the insulating layer and electrically contacting the drain electrode in the opening of the insulating layer, wherein an angle between a side surface of the opening of the insulating layer and a plane parallel to the substrate is in a range of about 70 degrees to about 85 degrees.

13 Claims, 54 Drawing Sheets

DISPLAY DEVICE AND MANUFACTURING METHOD THEREOF

CROSS-REFERENCE TO RELATED APPLICATION

This application claims priority to and benefits of Korean Patent Application No. 10-2020-0057711 under 35 U.S.C. § 119, filed in the Korean Intellectual Property Office (KIPO) on May 14, 2020, the entire contents of which are incorporated herein by reference.

BACKGROUND

1. Technical Field

The present disclosure relates to a display device and a manufacturing method thereof.

2. Description of the Related Art

A display device is a device that displays an image. Emissive display devices have recently been in the spotlight as a self-emissive display device.

An emissive display device has a self-emissive characteristic, eliminating the necessity for a light source, unlike a liquid crystal display (LCD) device, and thus can be fabricated to be thinner and lighter. Further, the emissive display device has high quality characteristics such as low power consumption, high luminance, high response speed, and the like.

In general, an emissive display device includes a substrate, thin film transistors located on the substrate, insulating layers disposed between wires constituting the thin film transistors, and light emitting elements connected to the thin film transistors. A color filter may be disposed on a light emitting element to display colors. Recently, as the resolution of the display device increases, the size of individual light emitting elements has decreased.

The above information disclosed in this Background section is only for enhancement of understanding of the background of the disclosure, and therefore it may contain information that does not form the prior art that is already known in this country to a person of ordinary skill in the art.

SUMMARY

Embodiments have been made in an effort to provide a display device and a manufacturing method thereof, which prevents generation of a reflective color band at an edge of an emission area.

An embodiment of the disclosure provides a display device including a source electrode disposed on a substrate; a drain electrode disposed on the substrate; an insulating layer disposed on the source electrode and the drain electrode, the insulating layer including an opening overlapping the drain electrode; and a first electrode disposed on the insulating layer and electrically contacting the drain electrode in the opening of the insulating layer, wherein an angle between a side surface of the opening of the insulating layer and a plane parallel to the substrate is in a range of about 70 degrees to about 85 degrees.

The source electrode may include a first source electrode and a second source electrode electrically connected to each other, the drain electrode may include a first drain electrode and a second drain electrode electrically connected to each other, and the display device may further comprise an intermediate layer disposed between the first source electrode and the second source electrode and between the first drain electrode and the second drain electrode.

The insulating layer may include a siloxane or a polyimide.

The display device may further include a partition wall disposed on the first electrode and including a black material; a second electrode overlapping the first electrode; an emission layer disposed between the first electrode and the second electrode; an encapsulation layer disposed on the second electrode; and a sensing layer disposed on the encapsulation layer.

The display device may further include a plurality of color filters disposed on the sensing layer, and a light blocking member disposed between the plurality of color filters. The light blocking member and the partition wall may overlap each other.

The display device may not include a polarizing plate.

The insulating layer may include a black material.

The display device may further include a spacer disposed on the partition wall and including a black material.

The display device may further include a spacer disposed on the partition wall. The partition wall and the spacer may be integral with each other, and the partition wall, the spacer, and the insulating layer may include a black material.

An embodiment of the disclosure provides a display device including a source electrode disposed on a substrate; a drain electrode disposed on the substrate; a first insulating layer disposed on the source electrode and the drain electrode, the first insulating layer including a first opening overlapping the drain electrode; a second insulating layer overlapping an upper surface of the first insulating layer and a side surface of the first opening, the second insulating layer including a second opening overlapping the drain electrode; and a first electrode disposed on the second insulating layer and electrically contacting the drain electrode in the second opening of the second insulating layer. An angle between a side surface of the second opening of the second insulating layer and a plane parallel to the substrate may be in a range of about 70 degrees to about 85 degrees.

An angle between a side surface of the first opening of the first insulating layer and the plane parallel to the substrate and the angle between the side surface of the second opening of the second insulating layer and the plane parallel to the substrate may be equal to each other.

An angle between a side surface of the first opening of the first insulating layer and the plane parallel to the substrate and the angle between the side surface of the second opening of the second insulating layer and the plane parallel to the substrate may be different from each other.

The angle between the side surface of the first opening of the first insulating layer and the plane parallel to the substrate may be smaller than the angle between the side surface of the second opening of the second insulating layer and the plane parallel to the substrate.

An angle between a side surface of the first opening of the first insulating layer and the plane parallel to the substrate may be equal to or less than about 45 degrees.

Each of a thickness of the first insulating layer and a thickness of the second insulating layer may be in a range of about 1.5 μm to about 3.0 μm.

The first insulating layer and the second insulating layer may include different materials.

The first insulating layer and the second insulating layer may include a same material.

The first insulating layer may include a siloxane or a polyimide, and the second insulating layer may include a siloxane or a polyimide.

The source electrode may include a first source electrode and a second source electrode electrically connected to each other, the drain electrode may include a first drain electrode and a second drain electrode electrically connected to each other, and the display device may further comprise an intermediate layer disposed between the first source electrode and the second source electrode and between the first drain electrode and the second drain electrode.

The second insulating layer may include a black material.

The display device may further include a partition wall disposed on the first electrode and including a black material.

The display device may further include a spacer disposed on the partition wall and including a black material.

The display device may further include a partition wall disposed on the first electrode, and a spacer disposed on the partition wall, wherein at least one of the partition wall, the spacer, and the second insulating layer may include a black material.

The side surface of the first opening of the first insulating layer and the side surface of the second opening of the second insulating layer may be disposed on a same surface.

An angle between a side surface of the first opening of the first insulating layer and the plane parallel to the substrate may be in a range of about 70 degrees to about 85 degrees.

A side surface of the first insulating layer and a side surface of the first electrode may directly contact each other.

An embodiment of the invention provides a manufacturing method of a display device, including forming a source electrode and a drain electrode on a substrate; forming an insulating layer on the source electrode and the drain electrode; positioning a mask that includes a region overlapping the drain electrode and has different transmittances on the insulating layer to expose the insulating layer; etching the exposed insulating layer to form an opening overlapping the drain electrode; and exposing the insulating layer that includes the opening to increase a via hole angle between a side surface of the opening and a plane parallel to the substrate to be in a range of about 70 degrees to about 85 degrees.

The insulating layer may include a black material.

An embodiment of the invention provides a manufacturing method of a display device, including forming a source electrode and a drain electrode on a substrate; forming a first insulating layer on the source electrode and the drain electrode to include a first opening overlapping the drain electrode; forming a second insulating layer on the first insulating layer and the first opening of the first insulating layer; exposing the second insulating layer by using a mask that includes a region overlapping the drain electrode and has different transmittances; forming in the second insulating layer a second opening overlapping the drain electrode by etching the exposed second insulating layer; and exposing the second insulating layer that includes the second opening to increase a via hole angle between a side surface of the second opening and a plane parallel to the substrate to be in a range of about 70 degrees to about 85 degrees.

The mask used in the exposing of the second insulating layer may have a different transmittance in a region not overlapping the drain electrode than in other regions, and the forming of the second opening comprises not etching a portion of the second insulating layer to form a protrusion.

The method may further include forming a via hole angle between a side surface of the first opening of the first insulating layer and the plane parallel to the substrate and the via hole angle between the side surface of the second opening of the second insulating layer and the plane parallel to the substrate to be different from each other.

The forming of the first insulating layer may include forming the first insulating layer to have a thickness in a range of about 1.5 μm to about 3.0 μm, and the forming of the second insulating layer may include forming the first insulating layer to have a thickness in a range of about 1.5 μm to about 3.0 μm.

The first insulating layer and the second insulating layer may include different materials.

The first insulating layer and the second insulating layer may include a same material.

The second insulating layer may include a black material.

According to the embodiments, it is possible to provide a display device and a manufacturing method thereof, which prevents the generation of a reflective color band at an edge of an emission area.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
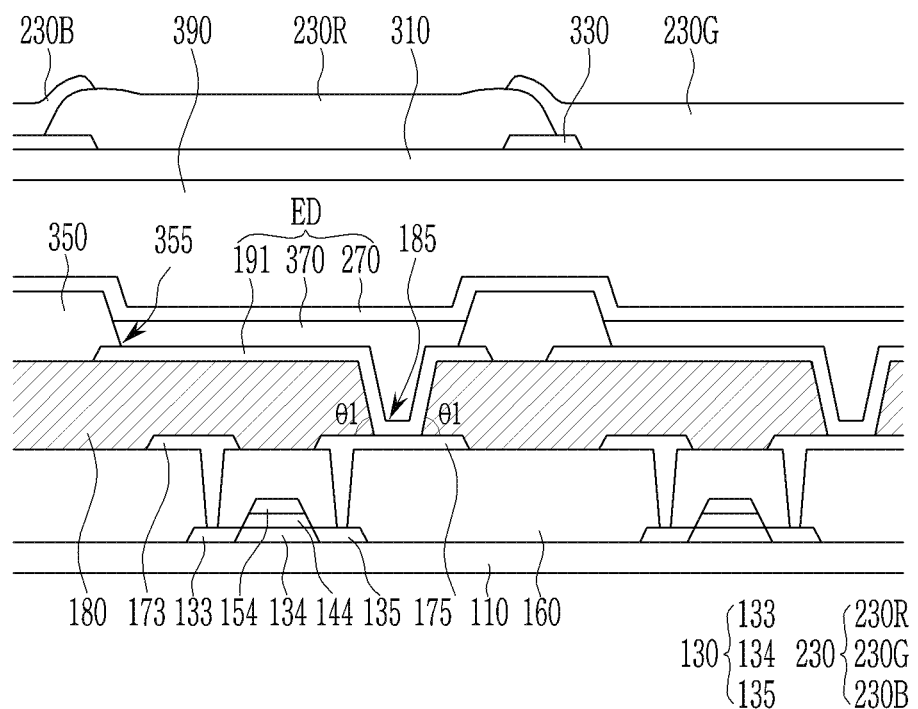
FIG. 1 schematically illustrates a cross-section of a display device according to an embodiment of the invention.

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

To clearly describe the disclosure, parts that are irrelevant to the description are omitted, and like numerals refer to like or similar elements throughout the specification.

Further, since sizes and thicknesses of elements shown in the accompanying drawings are arbitrarily given for better understanding and ease of description, the disclosure is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" (or "under" or "below") means being disposed on or below the object portion; in other words, they do not necessarily mean being disposed on the upper side (or lower side) of the object portion based on a gravitational direction.

In addition, unless explicitly described to the contrary, the word "comprise," and variations such as "comprises" or "comprising," will be understood to imply the inclusion of stated elements but not the exclusion of any other elements.

In addition, in the specification, "connected" means that two or more components are not only directly connected, but two or more components may be connected indirectly through other components, physically connected as well as being electrically connected. Connected portions may be separate from each other or may be integral with each other.

Further, in the specification, the phrase "in a plan view" means when an object portion is viewed from above, and the phrase "in a cross-sectional view" means when a cross-section taken by vertically cutting an object portion is viewed from the side.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, a display device according to an embodiment of the invention will be described in detail with reference to drawings.

FIG. 1 schematically illustrates a cross-section of a display device according to an embodiment of the invention. FIG. 1 schematically illustrates only some elements for convenience of description, and the invention is not limited thereto.

Referring to FIG. 1, a semiconductor layer 130 may be disposed on a substrate 110 including plastic or glass. The semiconductor layer 130 may include a source region 133, a channel region 134, and a drain region 135. The semiconductor layer 130 may include any one of amorphous silicon, polycrystalline silicon, monocrystalline silicon, and an oxide semiconductor.

A gate insulating pattern 144 may be disposed to overlap the channel region 134 of the semiconductor layer 130. The gate insulating pattern 144 may not substantially overlap a conductive region of the semiconductor layer 130.

A gate electrode 154 may be disposed on the gate insulating pattern 144. The gate electrode 154 may overlap the channel region 134 of the semiconductor layer 130 in a direction that is perpendicular to the substrate 110. The gate electrode 154, the semiconductor layer 130, a source electrode 173, and a drain electrode 175 form (or constitute) a transistor.

An interlayer insulating layer 160 may be disposed on the semiconductor layer 130. The interlayer insulating layer 160 may include a silicon nitride ($SiN_x$), a silicon oxide ($SiO_x$), or a silicon oxynitride (SiON). The interlayer insulating layer 160 may be a multilayer including a silicon nitride ($SiN_x$), a silicon oxide ($SiO_x$), or a silicon oxynitride (SiON).

The interlayer insulating layer 160 may include openings overlapping the source region 133 and the drain region 135 of the semiconductor layer 130, respectively. The source electrode 173 and the drain electrode 175 may be disposed on the interlayer insulating layer 160. The source electrode 173 may be electrically connected to the source region 133 of the semiconductor layer 130 through the opening of the interlayer insulating layer 160. The drain electrode 175 may be electrically connected to the drain region 135 of the semiconductor layer 130 through the opening of the interlayer insulating layer 160.

An insulating layer 180 is disposed on the source electrode 173 and the drain electrode 175. The insulating layer 180 may include an organic material. Although the insulating layer 180 is illustrated in FIG. 1 as a single layer, the insulating layer 180 may have a multi-layer structure of two or more layers. The insulating layer 180 may include a siloxane or a polyimide.

Referring to FIG. 1, the insulating layer 180 may have an opening 185 overlapping the drain electrode 175. In the opening 185, a first electrode 191 and the drain electrode 175 electrically contact each other.

An angle θ1 between a side surface of the opening 185 of the insulating layer 180 and an upper surface of the drain electrode 175 may be in a range of about 70 degrees to about 85 degrees. In other words, an angle between the side surface of the opening 185 of the insulating layer 180 and a plane parallel to the substrate 110 is about 70 degrees to about 85 degrees, and it is therefore possible to prevent generation of a reflective color band in the display device. (In this disclosure, the plane that is a reference for measuring an angle is a plane that is parallel to the substrate 110.) A specific effect of the insulating layer 180 according to an embodiment will be described below.

In case that the angle θ1 between the side surface of the opening 185 of the insulating layer 180 and the upper surface of the drain electrode 175 is less than about 70 degrees, a sufficient effect of preventing the generation of the reflective color band may not be obtained. In case that the angle θ1 between the side surface of the opening 185 of the insulating layer 180 and the upper surface of the drain electrode 175 is greater than about 85 degrees, the slope of the side surface is steep and may cause a crack of the first electrode 191.

Still referring to FIG. 1, a partition wall 350 is disposed on the first electrode 191. The partition wall 350 may include an opening 355 overlapping the first electrode 191, and an emission layer 370 may be disposed in the opening 355 of the partition wall 350. A second electrode 270 may be disposed on the partition wall 350 and the emission layer 370. The first electrode 191, the emission layer 370, and the second electrode 270 may form a light emitting diode ED. The partition wall 350 may include a black material. Accordingly, the partition wall 350 may function as a light blocking member.

An encapsulation layer 390 may be disposed on the first electrode 270. The encapsulation layer 390 may be a multilayer including an organic layer and an inorganic layer. A sensing layer 310 may be, for example, a touch sensing layer 310. The touch sensing layer 310 may be disposed on the encapsulation layer 390. In FIG. 1, the touch sensing layer 310 is schematically illustrated, but the touch sensing layer 310 may include sensing electrodes disposed on different layers while being insulated from each other, and an insulating layer disposed between the sensing electrodes.

In FIG. 1, light blocking members 330 may be disposed on the touch sensing layer 310. The light blocking member 330 may be disposed to overlap the partition wall 350 in a direction that is perpendicular to the substrate 110.

A color filter 230 may be disposed between the light blocking members 330. The color filter 230 may include a red color filter 230R, a green color filter 230G, and a blue color filter 230B. One color filter may be disposed to correspond to one light emitting diode ED. As illustrated in FIG. 1, neighboring color filters 230 may overlap each other on the light blocking members 330. Although the color filter 230 is illustrated in FIG. 1, the color filter 230 may be a color conversion layer including quantum dots according to an embodiment. In this case, the red color conversion layer may be disposed in an area where the red color filter 230R is disposed, the green color conversion layer may be disposed in an area where the green color filter 230G is disposed, and a transmission layer may be disposed in an area where the blue color filter 230B is disposed.

Referring to FIG. 1, the display device according to an embodiment may not include a polarizing plate therein. In case that the display device includes a polarizing plate, it is possible to prevent generation of a reflective color band in an emission area by the polarizing plate. However, in the case where the polarizing plate is not included as in an embodiment, the reflective color band may be generated at an edge of the opening 355 of the partition wall 350.

Figure 2A:
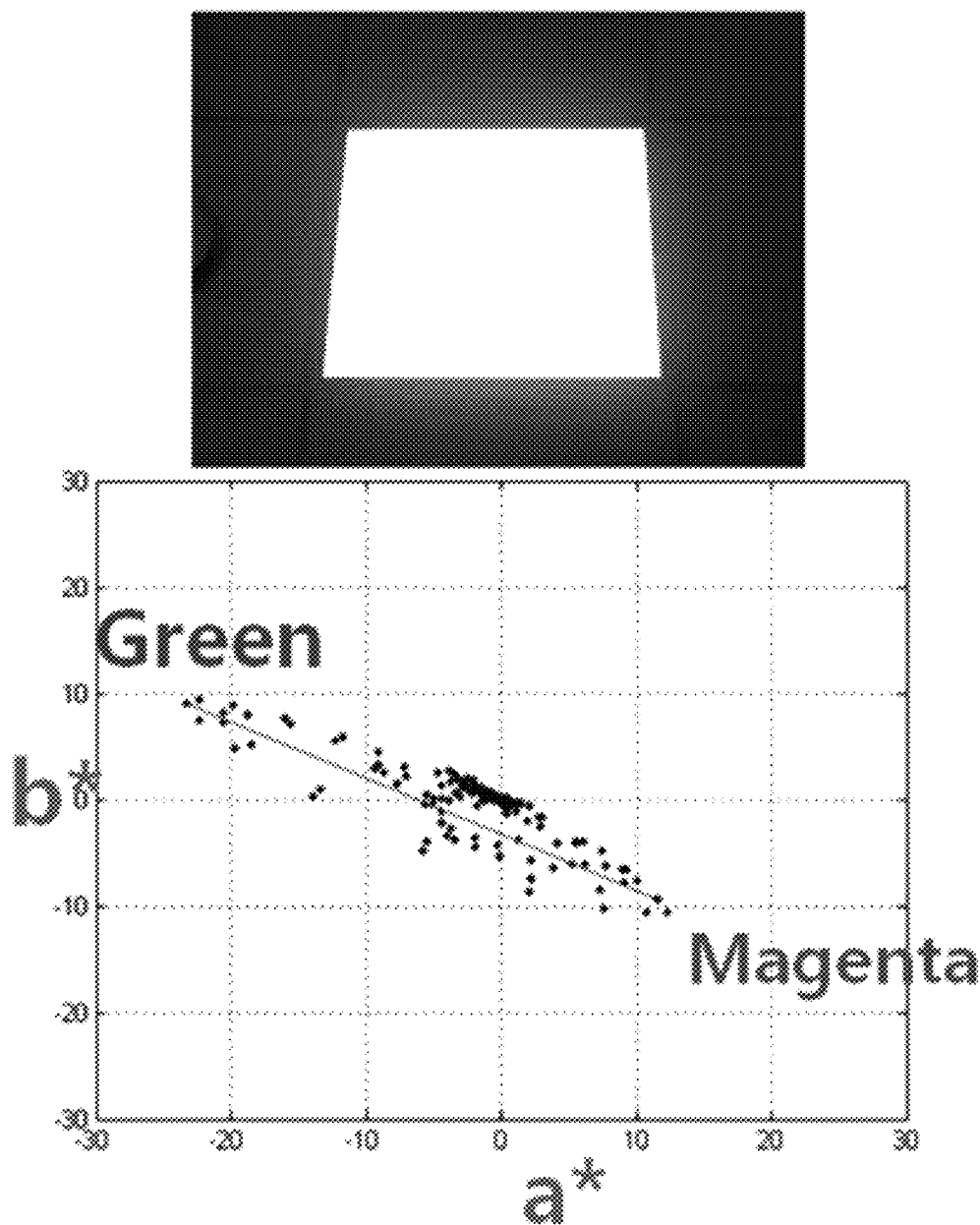
FIG. 2A schematically illustrates an image and color distribution of a display device that includes no polarizing plate and has a reflective color band, and FIG. 2B schematically illustrates an image and color distribution of a display device that includes a polarizing plate and has no reflective color band.
Figure 2B:
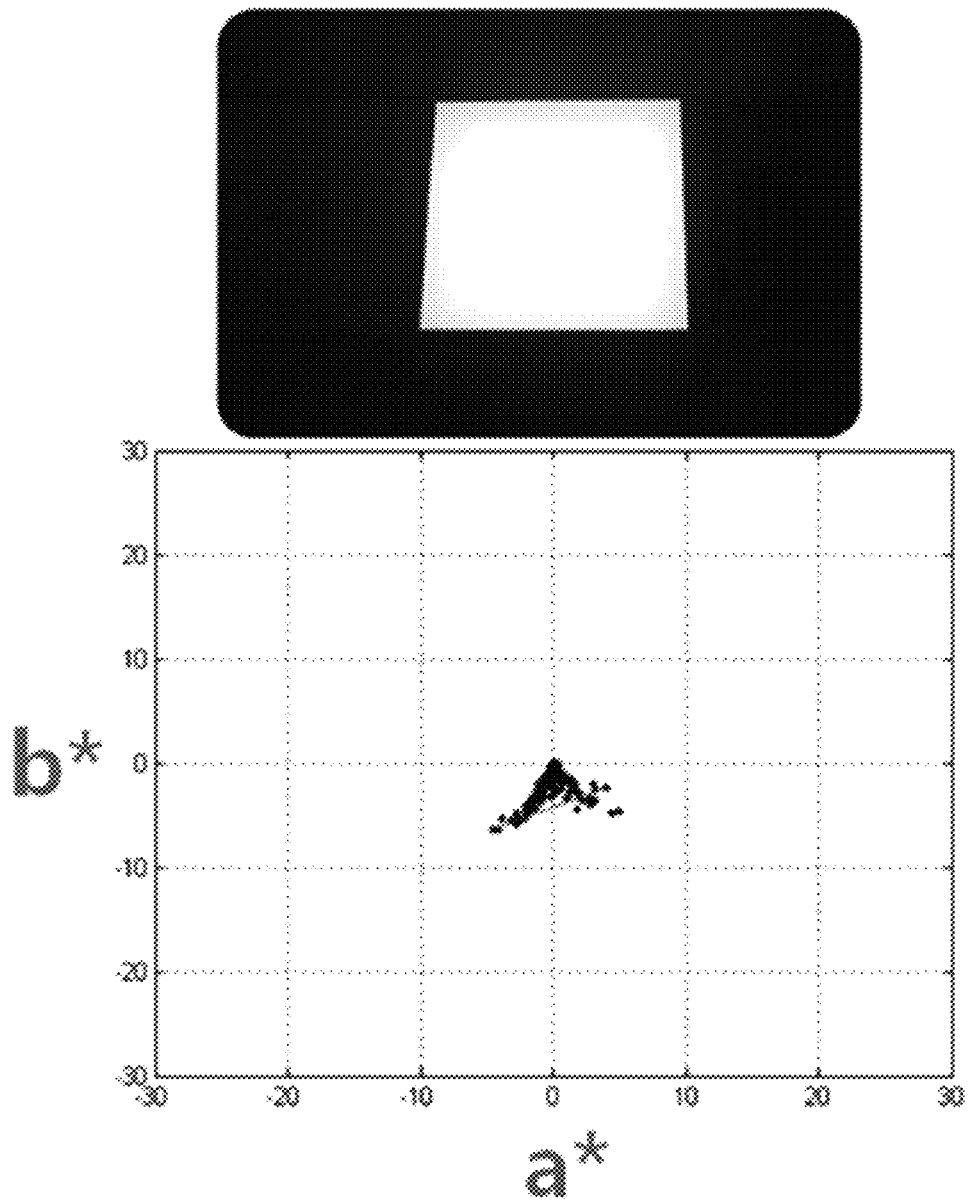

FIG. 2A schematically illustrates an image and color distribution of a display device that includes no polarizing plate and has a reflective color band, and FIG. 2B schematically illustrates an image and color distribution of a display device that includes a polarizing plate and has no reflective color band. Comparing FIG. 2A and FIG. 2B, in the case of the display device in which the reflective color band is generated, green and purple are visually recognized at the edge of the emission area. Color distribution is widely scattered, and a maximum color difference ΔE00 is about 22.24.

Referring to FIG. 2B, in the case of a display device in which no reflective color band is generated, the color distribution appears narrowly, and the maximum color difference ΔE00 is as low as about 9.75.

In case that the display device does not include a polarizing plate, a reflective color band may be generated. However, a display device according to an embodiment that includes the opening 185 in the insulating layer 180 having the via hole angle in a range of about 70 degrees to about 85 degrees may prevent the generation of the reflective color band even without a polarizing plate. This is because, as the via hole angle of the opening 185 increases, diffuse reflection occurring at a side surface of the opening 185 is reduced. As the diffuse reflection decreases, the generation of the reflective color band is prevented.

However, in case that the via hole angle of the opening 185 is less than about 70 degrees, the effect of suppressing the diffuse reflection is insufficient, and thus the reflective color band may be generated. In case that the via hole angle of the opening 185 is about or greater than about 85 degrees, the crack of the first electrode 191 may occur on the side surface of the opening 185.

Table 1 below shows experimental results of generation of the reflective color band for Experimental Example 1 and Experimental Example 2 under the same conditions except for the via hole angle of the opening of the insulating layer.

TABLE 1

|  | Experimental Example 1 (FIG. 3A) | Experimental Example 2 (FIG. 3B) |
| --- | --- | --- |
| Insulating layer thickness (μm) | 2.8 | 2.8 |
| Via hole angle of opening of insulating layer | 45° | 80° |
| Flatness | 51.2 nm | 51.7 nm |
| Maximum color difference ΔE00 | 30.6 | 23.0 |

Figure 3A:
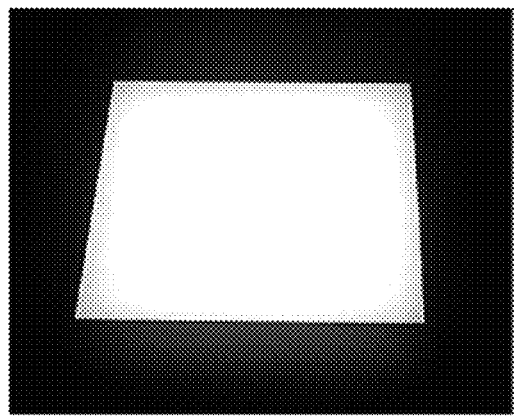
FIG. 3A schematically illustrates an image and color distribution of a display device in which the via hole angle of the opening of the insulating layer was about 45 degrees.
Figure 3A:
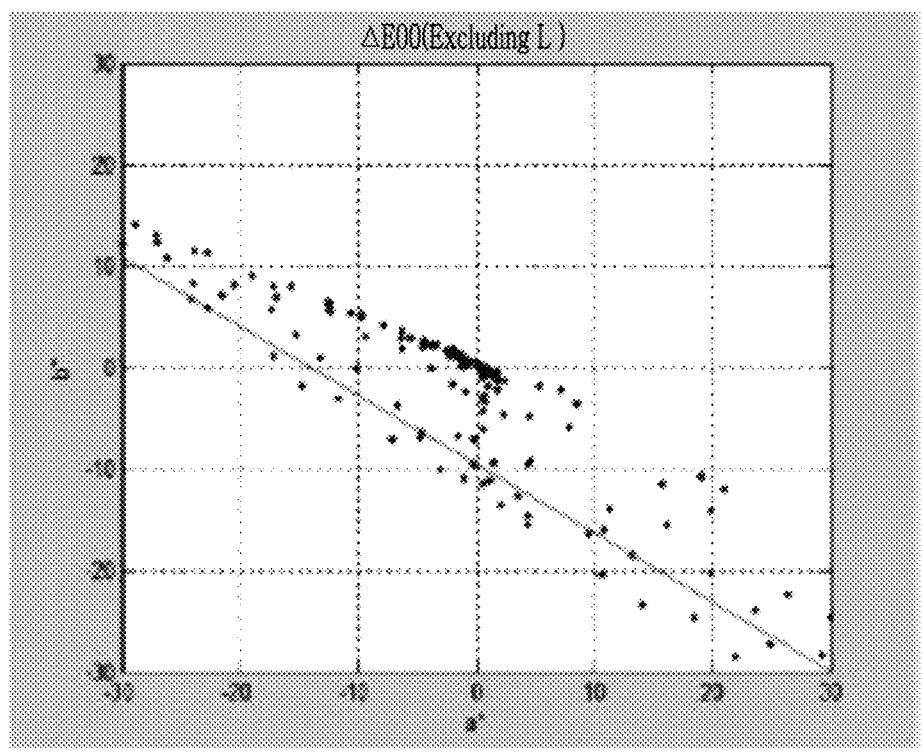
Figure 3B:
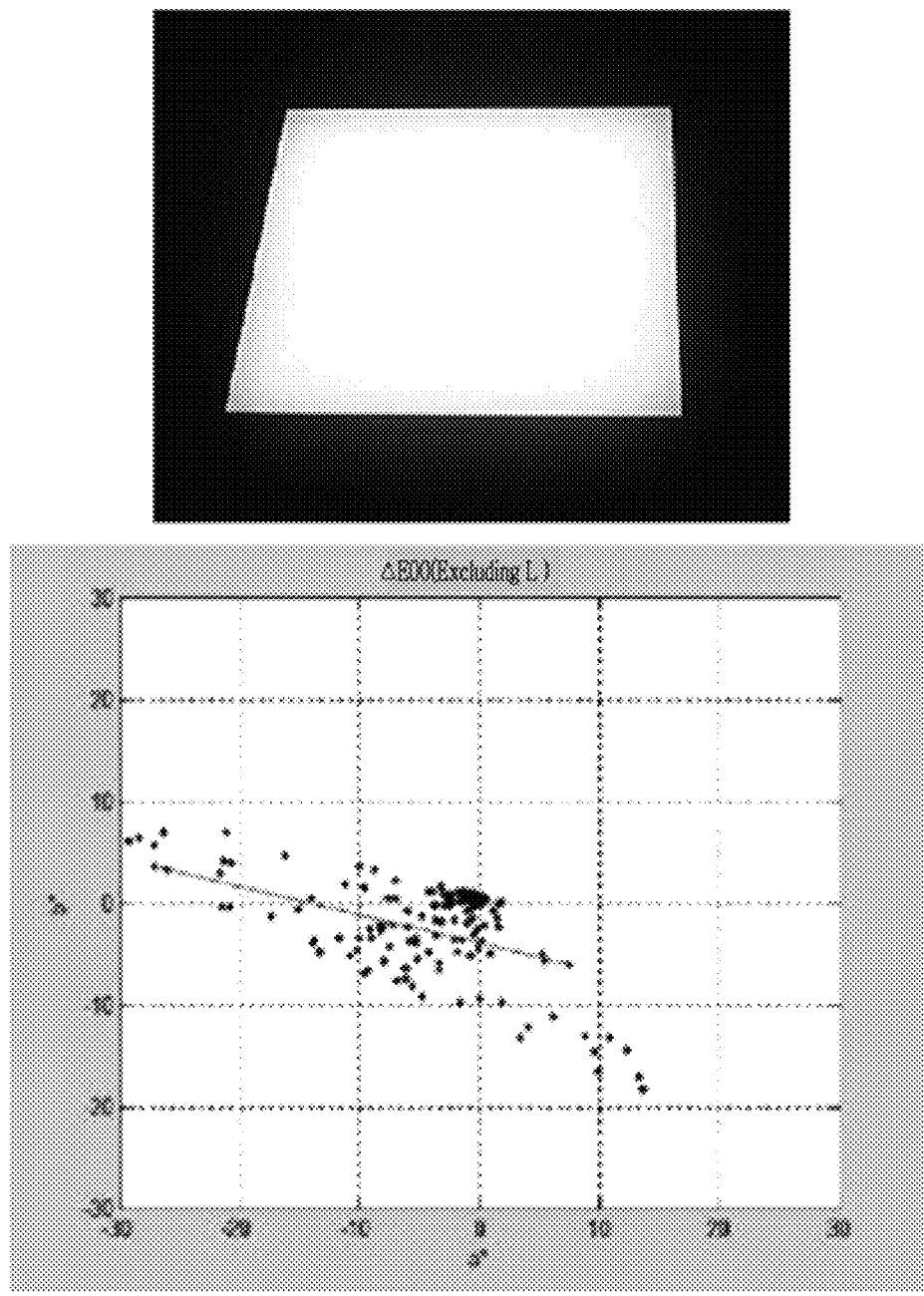
FIG. 3B schematically illustrates an image and color distribution of a display device in which the via hole angle of the opening of the insulating layer was about 80 degrees.

Referring to Table 1, it was confirmed that, in Experimental Example 1 in which the via hole angle of the opening of the insulating layer was about 45 degrees, the maximum color difference ΔE00 was about 30.6, but in Experimental Example 2 in which the via hole angle of the opening of the insulating layer was about 80 degrees, the maximum color difference ΔE00 was decreased to about 23.0. With images of Experimental Example 1 and Experimental Example 2, it was seen that in Experimental Example 1, green and purple color bands were observed at the edge of the opening, but in Experimental Example 2, a separate color band was not observed at the edge of the opening. FIGS. 3A and 3B illustrate images of the Experimental Examples 1 and 2 and the a*, b* distributions thereof, respectively.

As described above, the display device according to the embodiment of the disclosure may not include a polarizing plate therein and may include the opening 185 in the insulating layer 180, the opening 185 having the via hole angle in a range of about 70 degrees to about 85 degrees, in which the drain electrode and the first electrode are connected. Accordingly, it is possible to prevent the generation of the reflective color band of the display device.

The single-layered insulating layer 180 has been described as an example, but the insulating layer may be multi-layered. Hereinafter, another embodiment will be described.

Figure 4A:
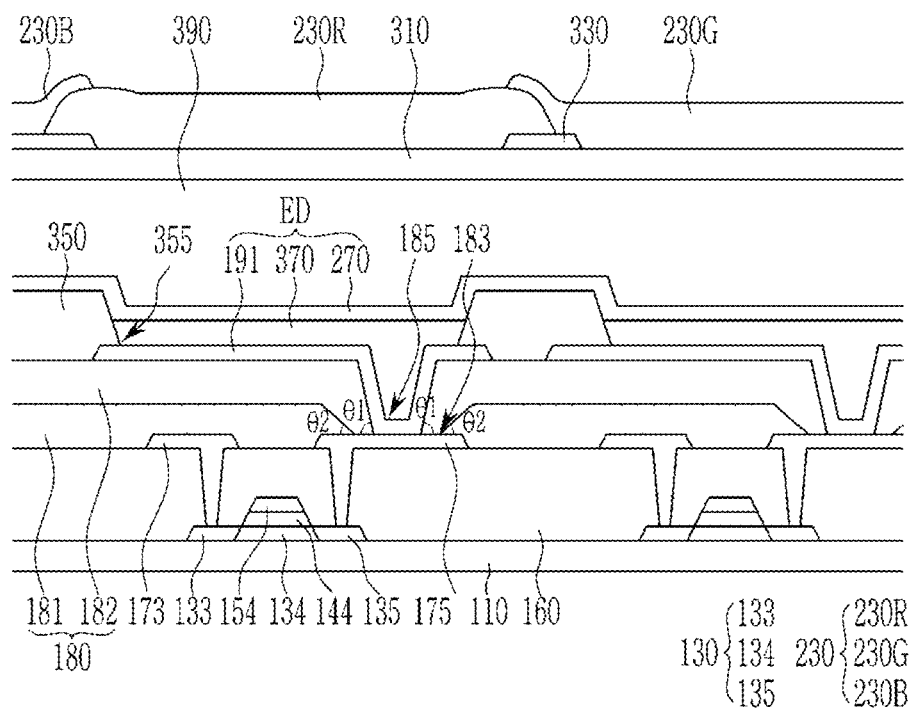
FIG. 4A schematically illustrates a cross-section of a display device according to another embodiment.

FIG. 4A schematically illustrates a cross-section of a display device according to another embodiment. Referring to FIG. 4A, the display device according to an embodiment is identical to the display device of FIG. 1 except that the insulating layer 180 includes a first insulating layer 181 and a second insulating layer 182. A detailed description of the same elements will be omitted.

In an embodiment of FIG. 4A, the display device includes the first insulating layer 181 and the second insulating layer 182. All side surfaces and an upper surface of the first insulating layer 181 may overlap the second insulating layer 182. For example, the first insulating layer 181 may not directly contact the first electrode 191.

Referring to FIG. 4A, a size of an opening 183 of the first insulating layer 181 is larger than that of the opening 185 of the second insulating layer 182. For example, the opening 185 of the second insulating layer 182 may be disposed within the opening 183 of the first insulating layer 181.

The angle θ2 of the side surface of the opening 183 of the first insulating layer 181 with respect to the plane may be different from the angle θ1 of the side surface of the opening 185 of the second insulating layer 182 with respect to the plane. Specifically, the angle θ2 of the side surface of the opening 183 of the first insulating layer 181 with respect to the plane may be smaller than the angle θ1 of the side surface of the opening 185 of the second insulating layer 182 with respect to the plane. For example, the angle θ2 formed by the side surface of the opening 183 of the first insulating layer 181 with respect to the plane may be 45 degrees or less. The angle θ1 formed by the side surface of the opening 185 of the second insulating layer 181 with respect to the plane may be in a range of 70 to 85 degrees.

In case that the insulating layer 180 is a multilayer including the first insulating layer 181 and the second insulating layer 182, the flatness of the insulating layer 180 may be increased, thereby preventing the reflective color band more effectively.

The generation of the reflective color band is affected by the angle of the opening of the insulating layer 180 and the flatness of an upper portion of the insulating layer. In an embodiment, the insulating layer 180 is multi-layered to increase the flatness of the upper portion of the insulating layer, thereby preventing the generation of the reflective color band.

Table 2 below shows experimental results of generation of the reflective color band for Experimental Example 3 and Experimental Example 4 under the same conditions except that the insulating layer is a single or double layer.

TABLE 2

|  | Experimental Example 3 (FIG. 4B) | Experimental Example 4 (FIG. 4C) |
| --- | --- | --- |
| Insulating layer thickness (μm) | 2.8 | 3.1 |
| Insulating layer material | Siloxane monolayer | Siloxane/PI double layer |
| Flatness | 51.7 nm | 30.1 nm |
| Maximum color difference ΔE00 | 23.0 | 18.2 |

Figure 4B:
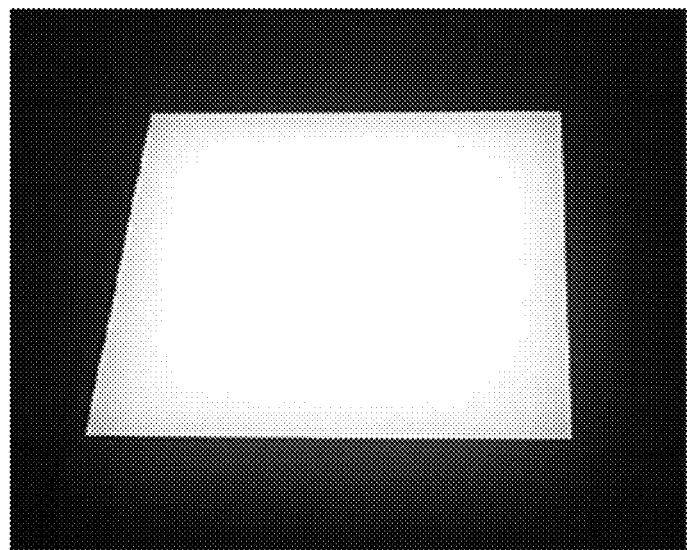
FIG. 4B schematically illustrates an image and color distribution of a display device in which the insulating layer was made of a single-layer.
Figure 4B:
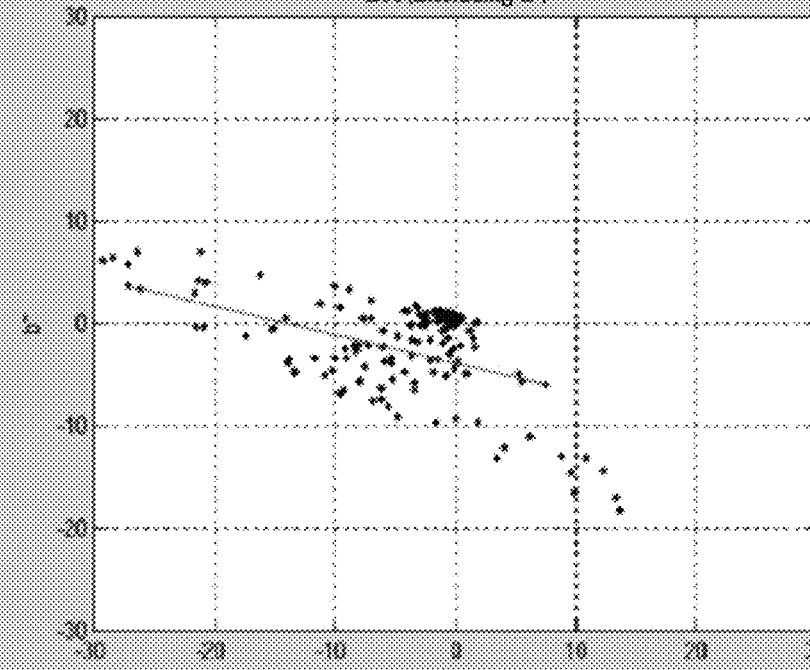
Figure 4C:
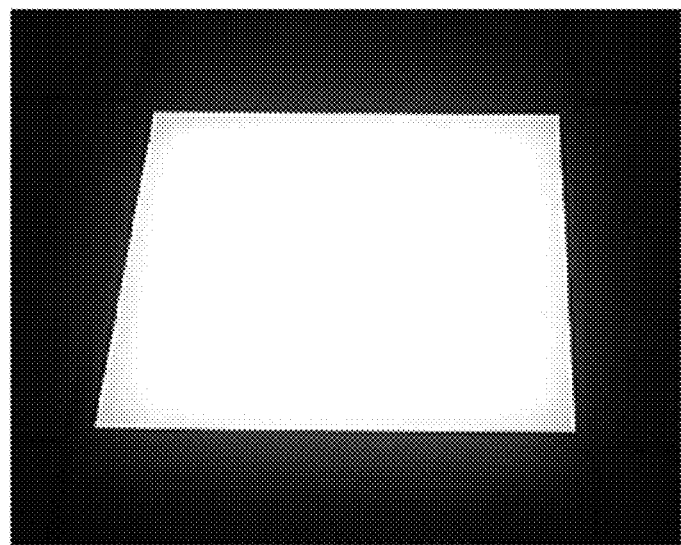
FIG. 4C schematically illustrates an image and color distribution of a display device in which the insulating layer was made of a multi-layer.
Figure 4C:
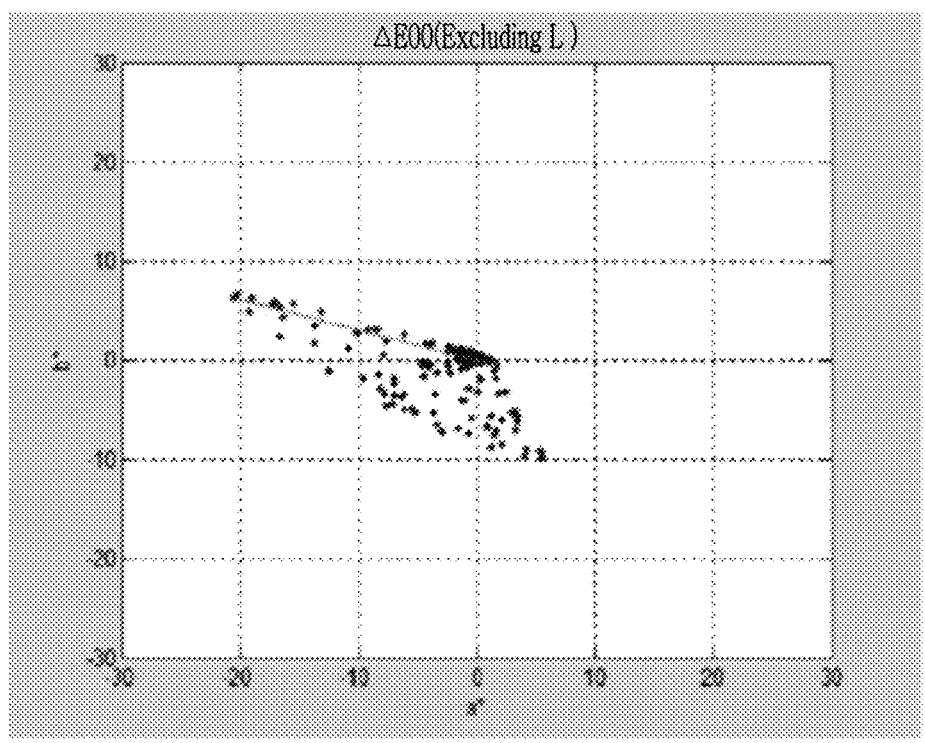

Referring to Table 2, it was confirmed that in Experimental Example 4 in which the insulating layer was made of a multi-layer, the flatness of the insulating layer was improved compared to Experimental Example 3 in which the insulating layer was made of a single-layer. It was confirmed that the maximum color difference ΔE00 of Experimental Example 4 in which the insulating layer was a multi-layer was about 18.2, which is less than about 23.0 of Experimental Example 3 in which the insulating layer was made as a single-layer. FIGS. 4B and 4C illustrate images of the Experimental Examples 3 and 4 and the a*, b* distributions thereof, respectively.

Thicknesses of the first insulating layer 181 and the second insulating layer 182 may be about 1.5 μm to about 3.0 μm, respectively. The thicknesses of the first insulating layer 181 and the second insulating layer 182 may be the same or different.

The first insulating layer 181 and the second insulating layer 182 may include a siloxane or a polyimide. The first insulating layer 181 and the second insulating layer 182 may include a same material or may include different materials. For example, the first insulating layer 181 may include a siloxane, and the second insulating layer 182 may include a polyimide. As another example, the first insulating layer 181 may include a polyimide, and the second insulating layer 182 may include a siloxane. As another example, the first insulating layer 181 and the second insulating layer 182 may include a polyimide, or the first insulating layer 181 and the second insulating layer 182 may include a siloxane.

In FIG. 4A, there is illustrated a configuration in which the angle θ2 formed by the side surface of the opening 183 of the first insulating layer 181 with respect to the plane and the angle θ1 formed by the side surface of the opening 185 of the second insulating layer 182 with respect to the plane are different, but the angle θ2 and the angle θ1 may be equal to each other.

Figure 5:
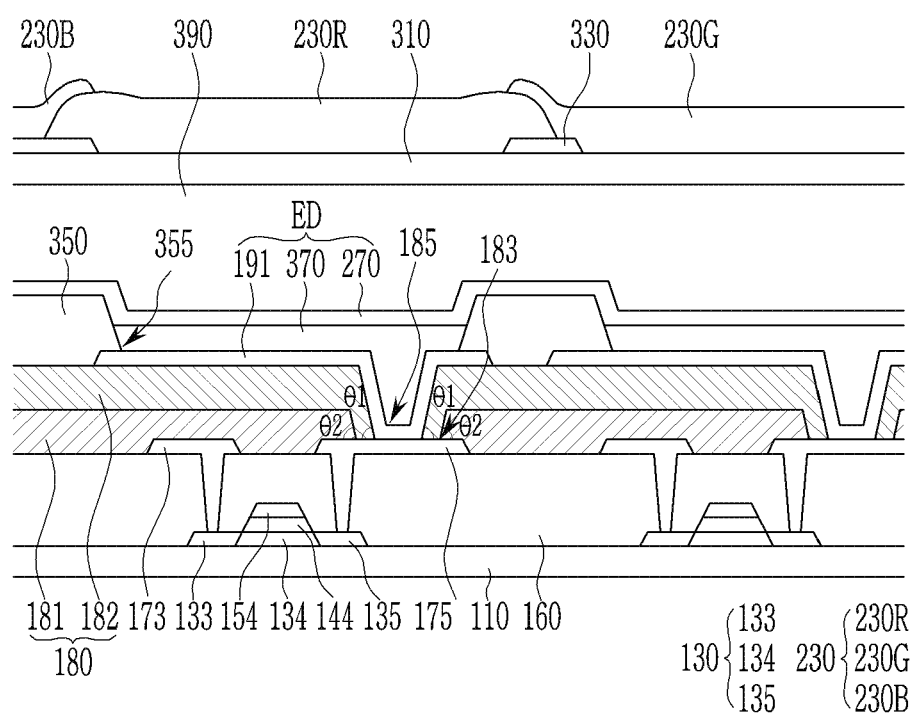
FIG. 5 schematically illustrates a cross-section of another embodiment.

FIG. 5 schematically illustrates a cross-section of a display device according to another embodiment. Referring to FIG. 5, the display device according to an embodiment is identical to the embodiment of FIG. 4A except that the angle θ2 formed by the side surface of the opening 183 of the first insulating layer 181 with respect to the plane and the angle θ1 formed by the side surface of the opening 185 of the second insulating layer 182 with respect to the plane are equal. A detailed description of the same elements will be omitted.

The angle θ2 may be equal to the angle θ1. The angle θ2 and the angle θ1 may be in a range of about 70 degrees to about 85 degrees.

Figure 6:
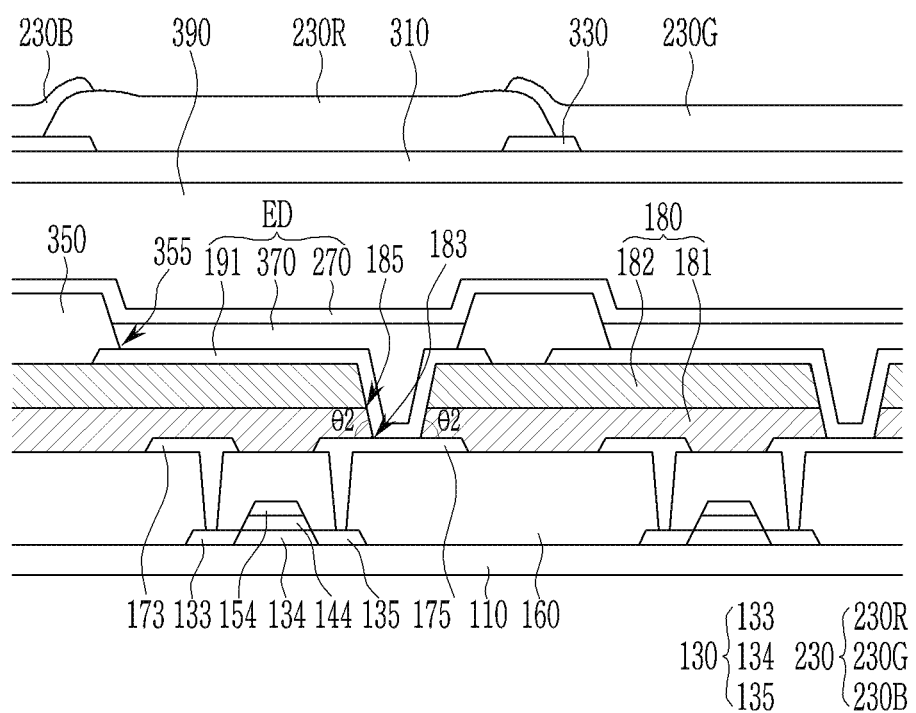
FIG. 6 schematically illustrates a cross-section of a display device according to another embodiment.

FIG. 6 schematically illustrates a cross-section of a display device according to another embodiment. Referring to FIG. 6, the display device according to an embodiment is identical to the embodiment of FIG. 5 except that the side surface of the opening 183 of the first insulating layer 181 and the side surface of the opening 185 of the second insulating layer 182 are disposed on the same surface. A detailed description of the same elements will be omitted.

Referring to FIG. 6, the side surface of the opening 183 of the first insulating layer 181 and the side surface of the opening 185 of the second insulating layer 182 are disposed on a same surface. The angle θ2 formed by the side surface of the opening 183 of the first insulating layer 181 with respect to the plane may be in a range of about 70 to about 85 degrees.

Since the side surface of the opening 183 of the first insulating layer 181 and the side surface of the opening 185 of the second insulating layer 182 are disposed on the same surface, the second insulating layer 182 may not directly contact the drain electrode 175, unlike the display device of FIG. 5.

In an embodiment, the first insulating layer 181 and the second insulating layer 182 may include different materials from each other or may include a same material. For example, the first insulating layer 181 may include a siloxane, and the second insulating layer 182 may include a polyimide. As another example, the first insulating layer 181 may include a polyimide, and the second insulating layer 182 may include a siloxane. As another example, the first insulating layer 181 and the second insulating layer 182 may include a polyimide, or the first insulating layer 181 and the second insulating layer 182 may include a siloxane.

In another embodiment of the present disclosure, the insulating layer 180 may include a black material. For example, the insulating layer 180 may include carbon black or an organic black material. In case that the insulating layer 180 has a multi-layer structure including the first insulating layer 181 and the second insulating layer 182 as shown in FIGS. 4A, 5, and 6, the second insulating layer 182 may include a black material. As illustrated in FIG. 1, in case that the insulating layer 180 is a single layer, the insulating layer 180 may include a black material.

Figure 7:
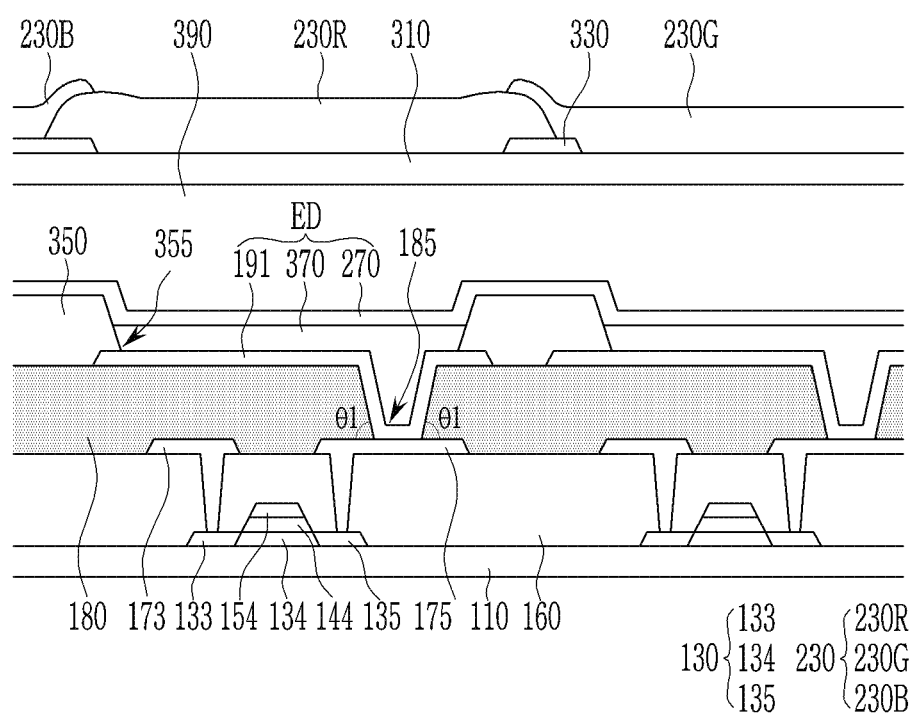
FIG. 7 schematically illustrates a cross-section of a display device according to another embodiment.

FIG. 7 schematically illustrates a cross-section of a display device according to another embodiment. Referring to FIG. 7, the display device according to an embodiment is identical to the display device of FIG. 1 except that the insulating layer 180 includes a black material. The insulating layer 180 may include carbon black or an organic black material and may have a black color. A detailed description of the same elements will be omitted.

Figure 8:
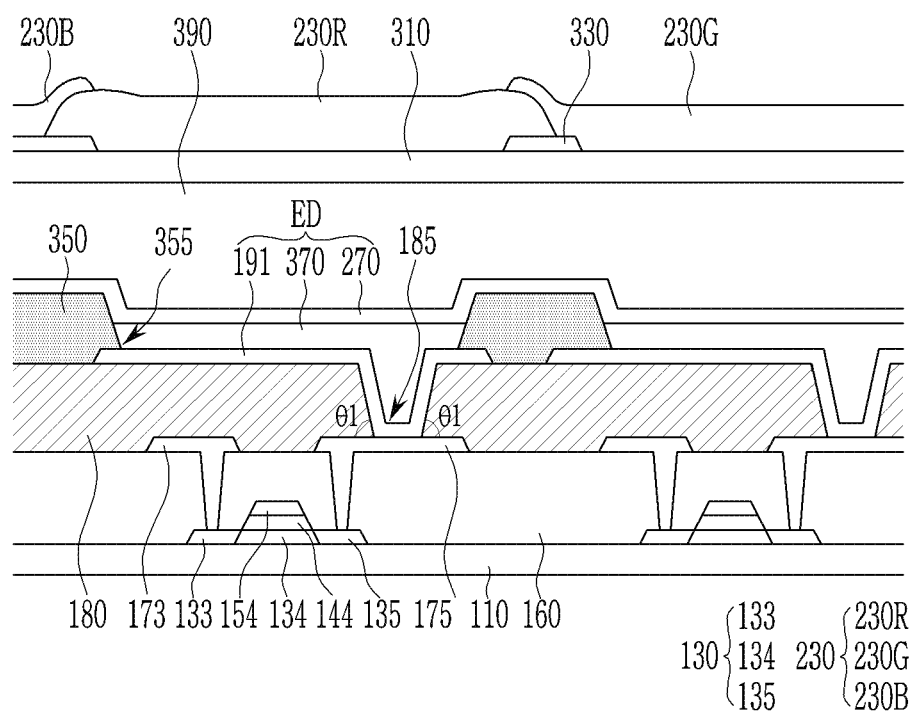
FIG. 8 schematically illustrates a cross-section of a display device according to another embodiment.

FIG. 8 schematically illustrates a cross-section of a display device according to another embodiment. Referring to FIG. 8 the display device according to an embodiment is identical to the display device of FIG. 1 except that the partition wall 350 includes a black material. The partition wall 350 may include carbon black or an organic black material and may have a black color.

Figure 9:
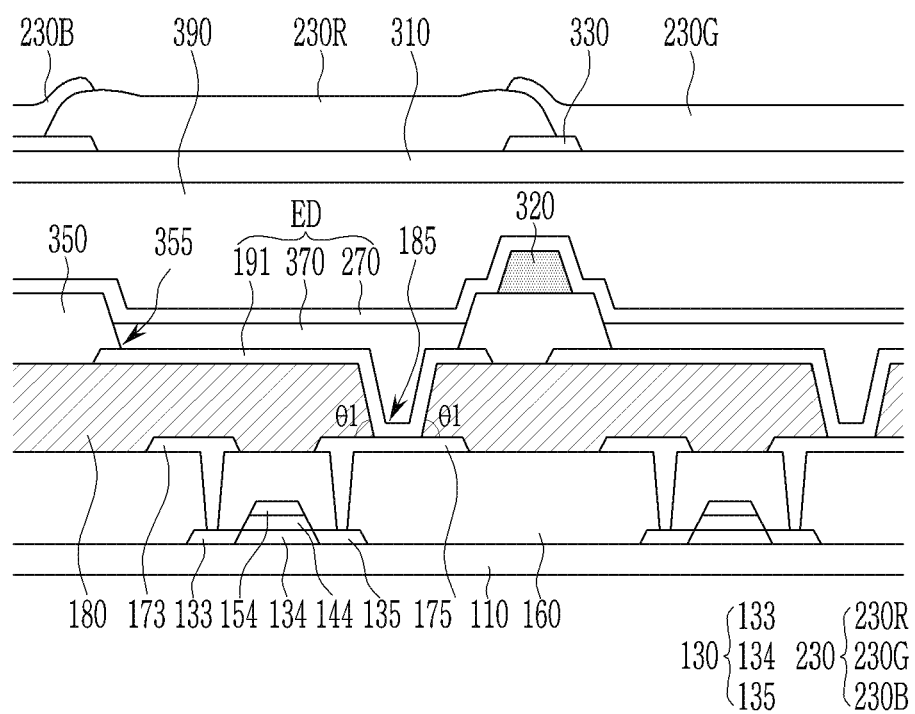
FIG. 9 schematically illustrates a cross-section of a display device according to another embodiment.

FIG. 9 schematically illustrates a cross-section of a display device according to another embodiment. The display device of FIG. 9 is identical to the display device of FIG. 1 except that a spacer 320 is disposed on the partition wall 350. The spacer 320 may be disposed on some of the partition walls 350 in the pixels, in which case FIG. 1 illustrates a cross-section of an area where the spacer 320 is not positioned, and FIG. 9 illustrates a cross-section of an area where the spacer 320 is positioned. Referring to FIG. 9, the spacer 320 may include a black material. For example, the spacer 320 may include carbon black or an organic black material and may have a black color.

Figure 10:
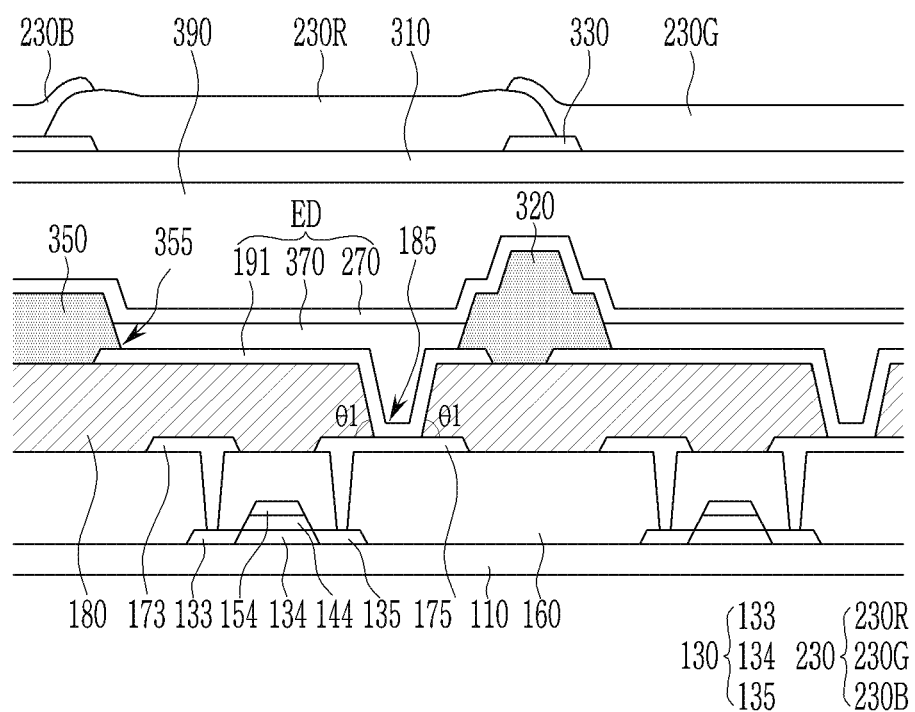
FIG. 10 schematically illustrates a cross-section of a display device according to another embodiment.

FIG. 10 schematically illustrates a cross-section of a display device according to another embodiment. The display device of FIG. 10 is identical to the display device of FIG. 9 except that the spacer 320 and the partition wall 350 are connected to or integral with each other and include a black material. A detailed description of the same elements will be omitted. In FIG. 10, the spacer 320 and the partition wall 350 may be formed in a same process.

Figure 11:
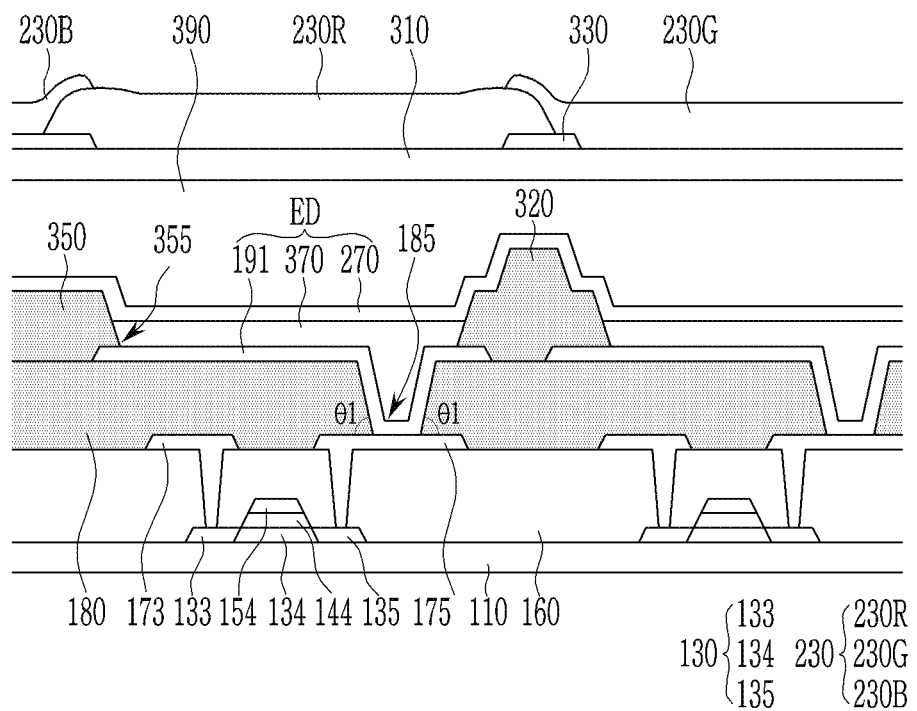
FIG. 11 schematically illustrates a cross-section of a display device according to another embodiment.
Figure 12:
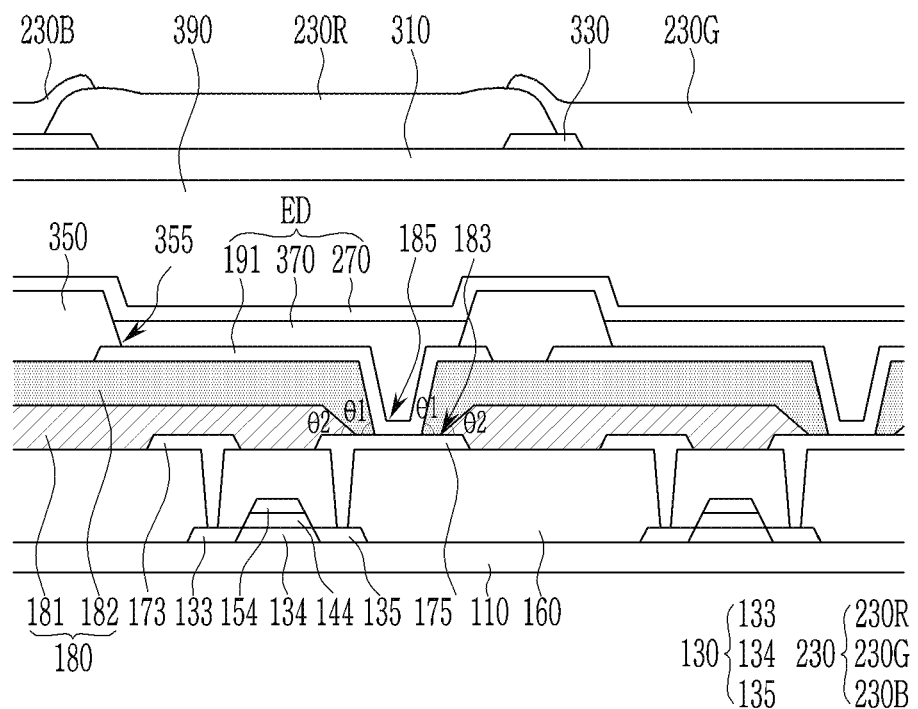
FIG. 12 schematically illustrates a cross-section of a display device according to another embodiment.

FIG. 11 schematically illustrates a cross-section of a display device according to another embodiment. Referring to FIG. 12, in the display device according to the embodiment, the insulating layer 180, the partition wall 350, and the spacer 320 disposed on the partition wall 350 include a black material. Other elements are the same as in FIG. 1, and detailed descriptions of the same elements will be omitted.

FIG. 12 schematically illustrates a cross-section of a display device according to another embodiment. Referring to FIG. 12, the display device according to an embodiment is the same as the display device of FIG. 4A except that the second insulating layer 182 includes a black material. The second insulating layer 182 may include carbon black or an organic black material and may have a black color. A detailed description of the same elements will be omitted.

Figure 13:
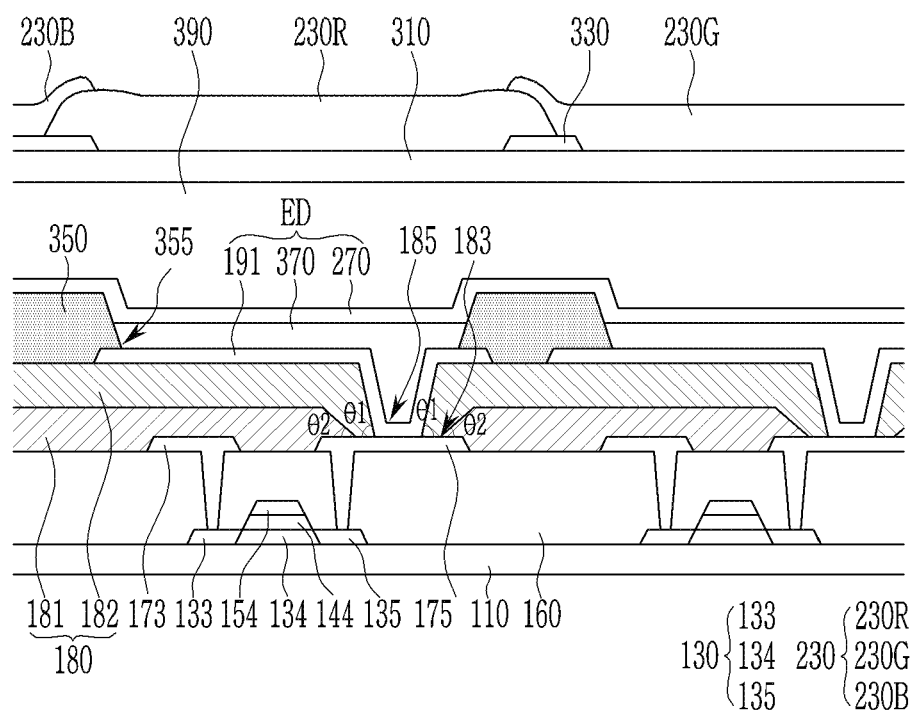
FIG. 13 schematically illustrates a cross-section of a display device according to another embodiment.

FIG. 13 schematically illustrates a cross-section of a display device according to another embodiment. Referring to FIG. 13 the display device according to an embodiment is identical to the display device of FIG. 4A except that the partition wall 350 includes a black material. The partition wall 350 may include carbon black or an organic black material and may have a black color.

Figure 14:
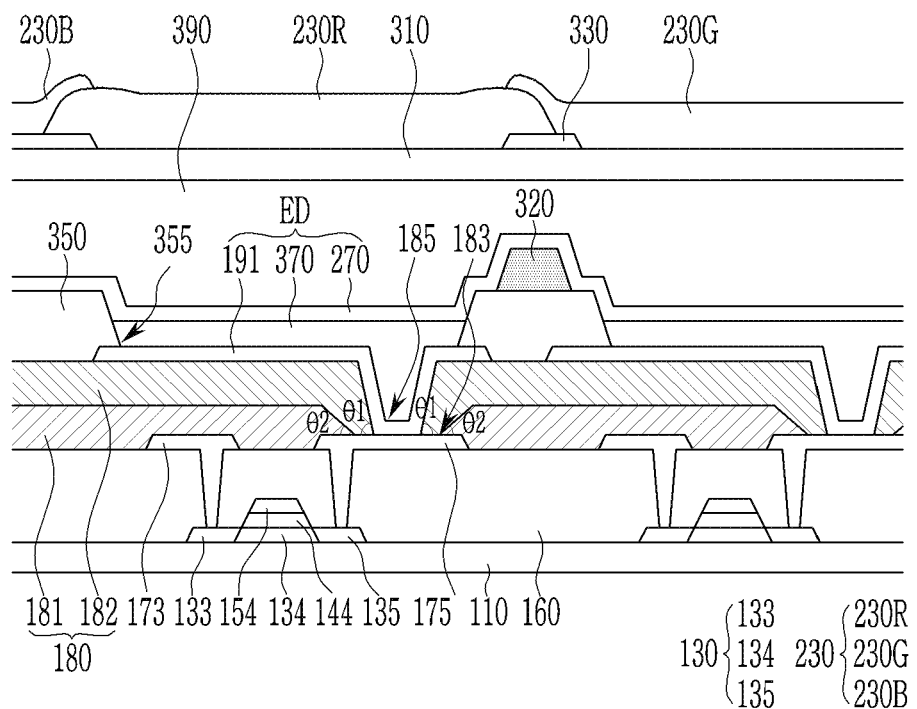
FIG. 14 schematically illustrates a cross-section of a display device according to another embodiment.

FIG. 14 schematically illustrates a cross-section of a display device according to another embodiment. The display device of FIG. 14 is identical to the display device of FIG. 4A except that the spacer 320 is disposed on the partition wall 350. Referring to FIG. 14, the spacer 320 may include a black material. For example, the spacer 320 may include carbon black or an organic black material and may have a black color.

Figure 15:
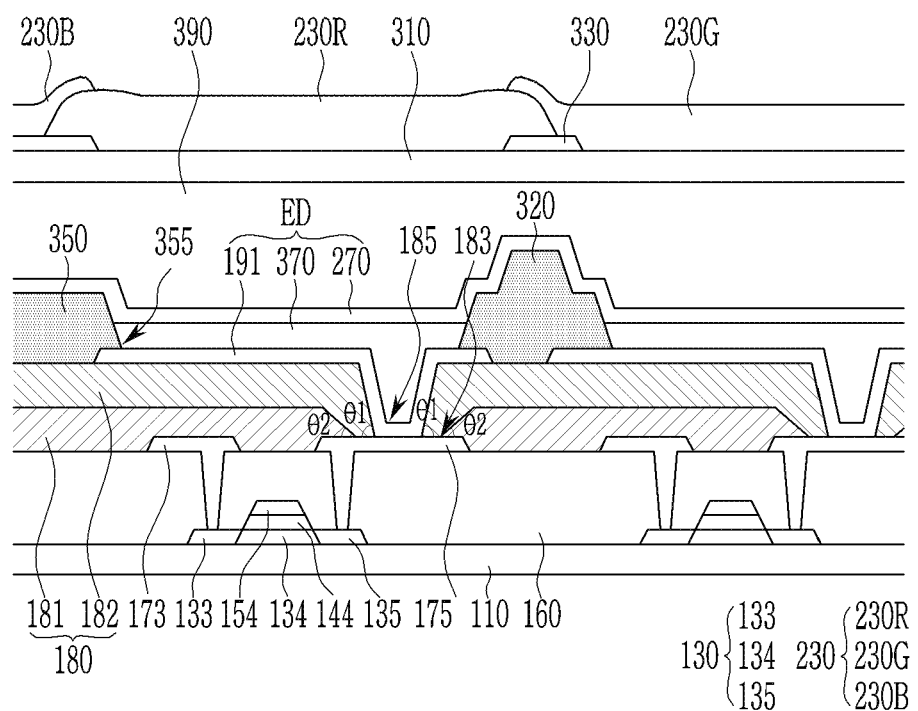
FIG. 15 schematically illustrates a cross-section of a display device according to another embodiment.

FIG. 15 schematically illustrates a cross-section of a display device according to another embodiment. The display device of FIG. 15 is identical to the display device of FIG. 14 except that the spacer 320 and the partition wall 350 are connected to each other and include a black material. A detailed description of the same elements will be omitted. In FIG. 15, the spacer 320 and the partition wall 350 may be formed in a same process.

Figure 16:
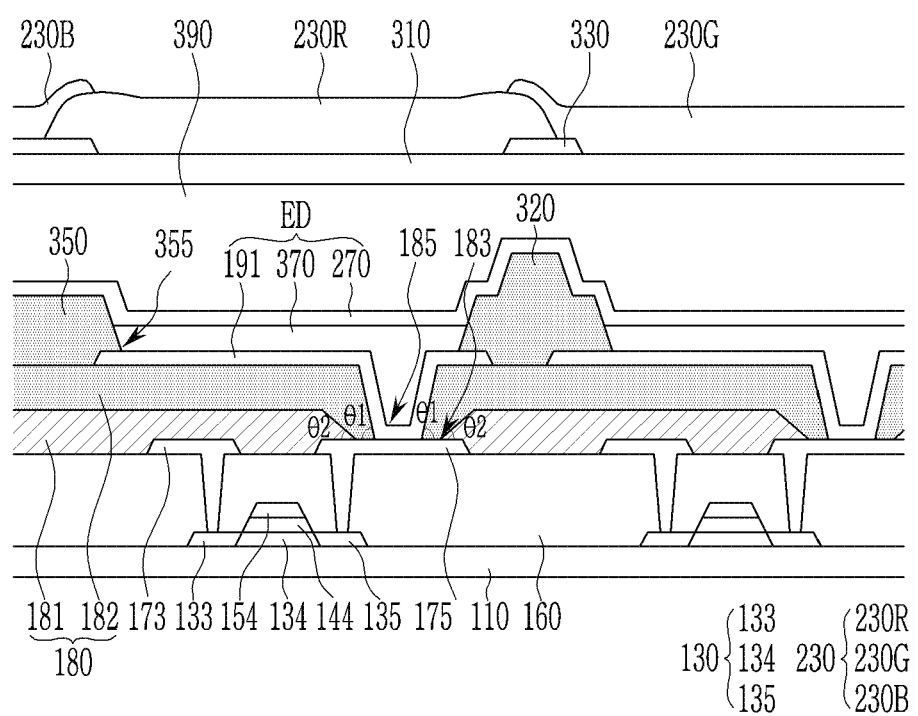
FIG. 16 schematically illustrates a cross-section of a display device according to another embodiment.

FIG. 16 schematically illustrates a cross-section of a display device according to another embodiment. Referring to FIG. 16, in the display device according to the embodiment, the insulating layer 180, the partition wall 350, and the spacer 320 disposed on the partition wall 350 include a black material. Other elements are the same as in FIG. 4A, and detailed descriptions of the same elements will be omitted.

Figure 17:
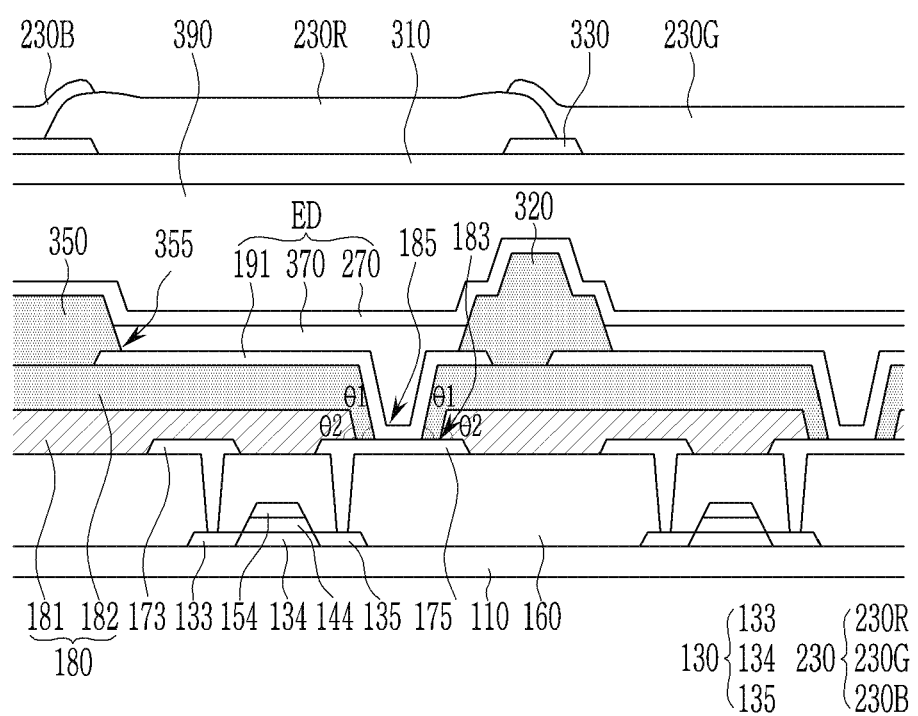
FIG. 17 schematically illustrates a cross-section of a display device according to another embodiment.

FIG. 17 illustrates a cross-section of a display device according to another embodiment. Referring to FIG. 17, the display device according to an embodiment is identical to the display device of FIG. 5 except that the insulating layer 180, the partition wall 350, and the spacer 320 disposed on the partition wall 350 include a black material. A detailed description of the same elements will be omitted. In FIG. 17, there is illustrated a configuration in which all of the insulating layer 180, the partition wall 350, and the spacer 320 include a black material, but in another embodiment, only some of them may include a black material.

Figure 18:
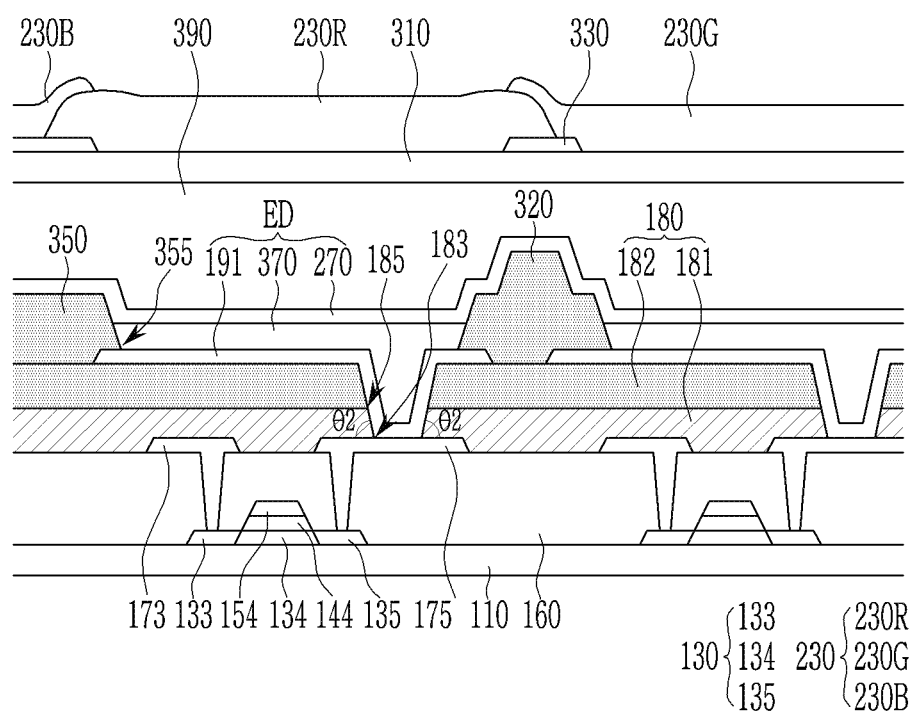
FIG. 18 schematically illustrates a cross-section of a display device according to another embodiment.

FIG. 18 schematically illustrates a cross-section of a display device according to another embodiment. Referring to FIG. 18, the display device according to an embodiment is identical to the display device of FIG. 6 except that the insulating layer 180, the partition wall 350, and the spacer 320 disposed on the partition wall 350 include a black material. A detailed description of the same elements will be omitted. In FIG. 18, there is illustrated a configuration in which all of the insulating layer 180, the partition wall 350, and the spacer 320 include a black material, but in another embodiment, only some of them may include a black material.

FIG. 1, FIG. 4A, and FIG. 5 to FIG. 18 schematically illustrate embodiments in which the source electrode 173 and the drain electrode 175 are disposed on a layer, but as shown in FIG. 19 to FIG. 34, the source electrode 173 and the drain electrode 175 may have a structure in which source electrodes 173a and 173b and drain electrodes 175a and 175b disposed on different layers are connected with an intermediate layer 161 therebetween. A specific structure will be described in detail below with reference to FIG. 19 to FIG. 34.

Figure 19:
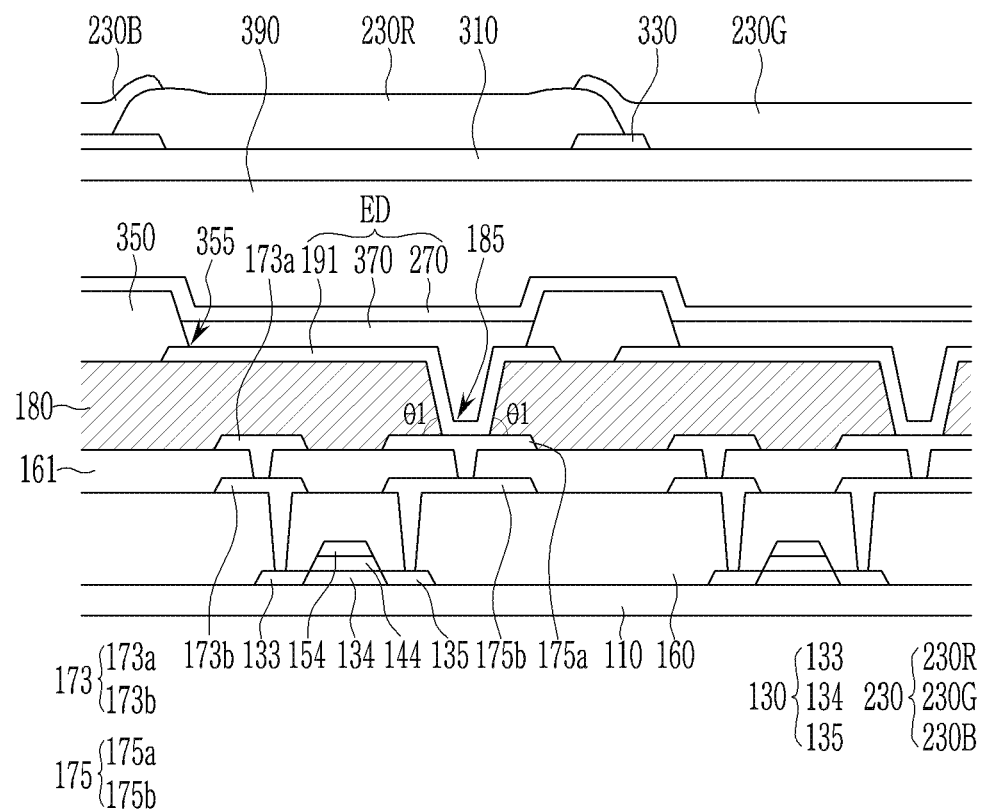
FIG. 19 schematically illustrates a cross-section of a display device according to another embodiment.

FIG. 19 schematically illustrates a cross-section of a display device according to another embodiment. Referring to FIG. 19, in the display device according to an embodiment, the display device is identical to the display device of FIG. 1 except that the source electrode 173 includes a first source electrode 173a and a second source electrode 173b, and the drain electrode 175 includes a first drain electrode 175a and a second drain electrode 175b. A detailed description of the same elements will be omitted. Referring to FIG. 19, the intermediate layer 161 is disposed between the first source electrode 173a and the second source electrode 173b and between the first drain electrode 175a and the second drain electrode 175b. The first source electrode 173a and the second source electrode 173b are electrically connected to each other in an opening of the intermediate layer 161, and the first drain electrode 175a and the second drain electrode 175b are electrically connected to each other in an opening of the intermediate layer 161.

In the embodiment where the source electrode and the drain electrode are disposed as a multilayer, the insulating layer 180 between the first electrode 191 and the first source electrode 173a and the first drain electrode 175a disposed in the upper layer may have the structure of the invention. For example, a via hole angle θ1 between the side surface of the opening 185 of the insulating layer 180 and the plane may be in a range of 70 degrees to 85 degrees. Accordingly, it is possible to prevent the generation of a reflective color band in a display device that does not include a polarizing plate.

Figure 20:
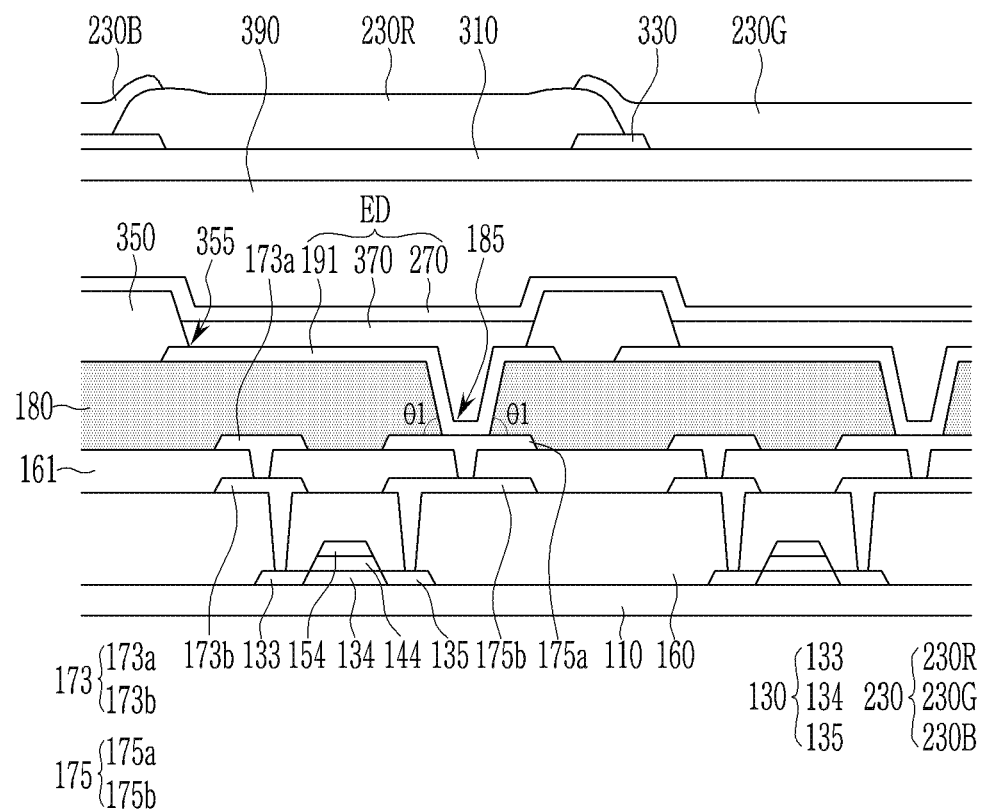
FIG. 20 schematically illustrates a cross-section of a display device according to another embodiment.

FIG. 20 schematically illustrates a cross-section of a display device according to another embodiment. Referring to FIG. 20, the display device according to an embodiment is identical to the display device of FIG. 19 except that the insulating layer 180 includes a black material. The insulating layer 180 may include carbon black or an organic black material and may have a black color. A detailed description of the same elements will be omitted.

Figure 21:
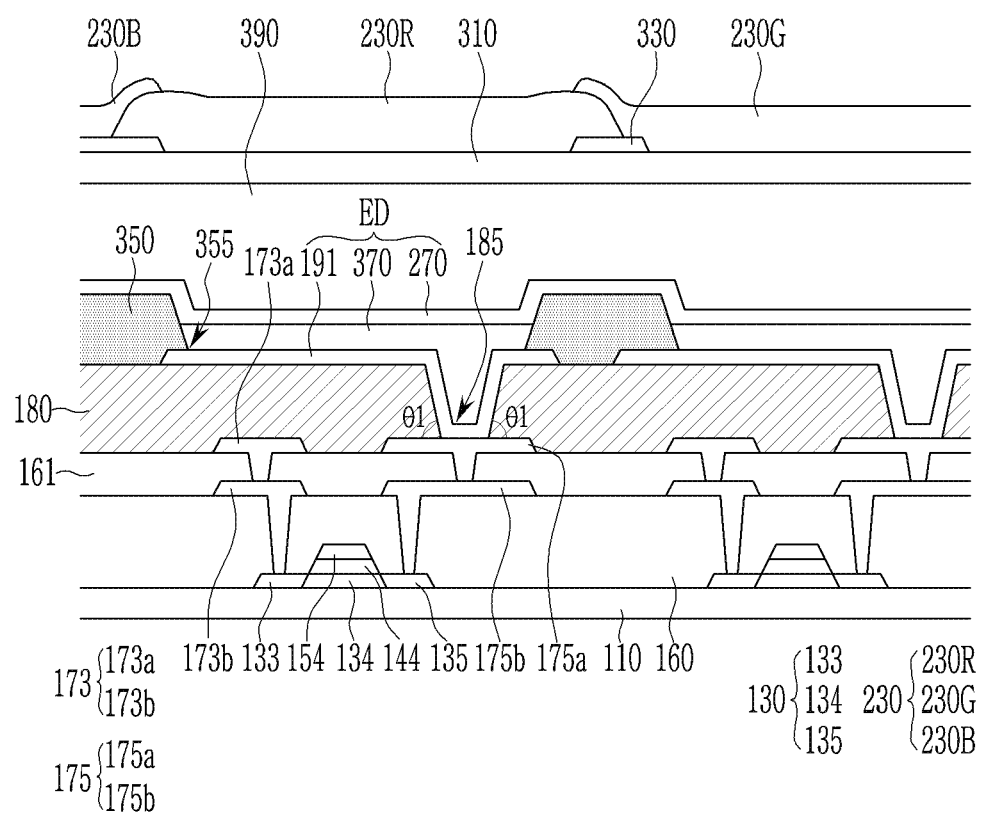
FIG. 21 schematically illustrates a cross-section of a display device according to another embodiment.

FIG. 21 schematically illustrates a cross-section of a display device according to another embodiment. Referring to FIG. 21 the display device according to an embodiment is identical to the display device of FIG. 19 except that the partition wall 350 includes a black material. The partition wall 350 may include carbon black or an organic black material and may have a black color.

Figure 22:
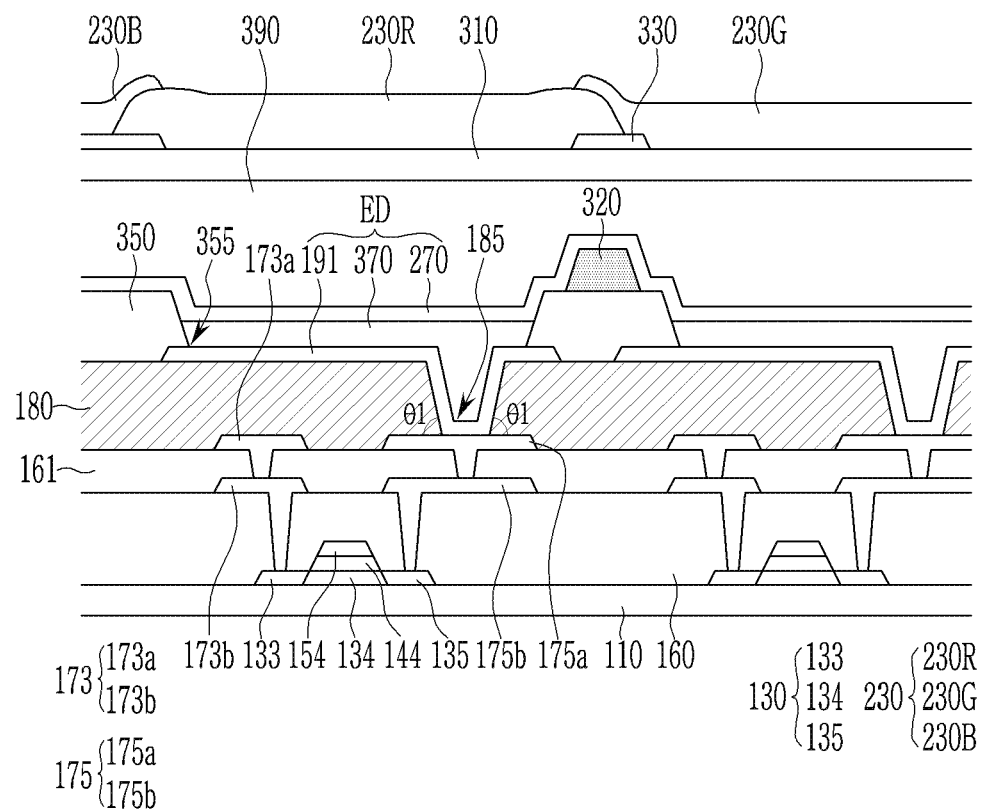
FIG. 22 schematically illustrates a cross-section of a display device according to another embodiment.

FIG. 22 schematically illustrates a cross-section of a display device according to another embodiment. The display device of FIG. 22 is identical to the display device of FIG. 19 except that the spacer 320 is disposed on the partition wall 350. Referring to FIG. 22, the spacer 320 may include a black material. For example, the spacer 320 may include carbon black or an organic black material and may have a black color.

Figure 23:
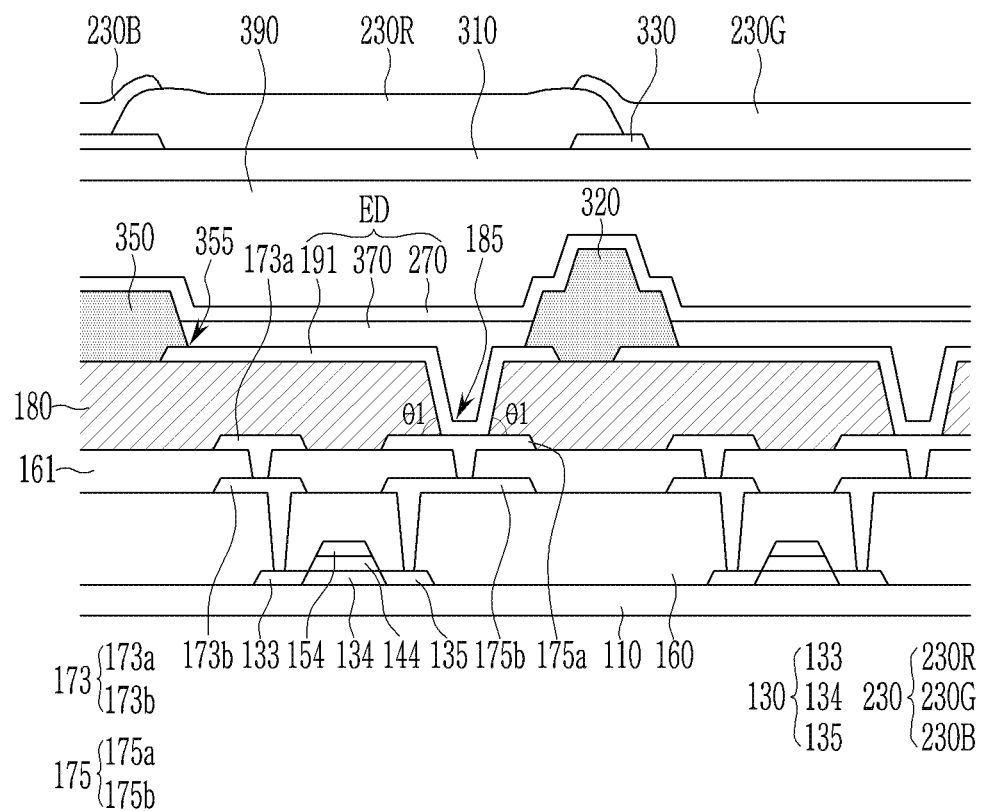
FIG. 23 schematically illustrates a cross-section of a display device according to another embodiment.

FIG. 23 schematically illustrates a cross-section of a display device according to another embodiment. The display device of FIG. 23 is identical to the display device of FIG. 22 except that the spacer 320 and the partition wall 350 are connected to each other and include a black material. A detailed description of the same elements will be omitted. The spacer 320 and the partition wall 350 may be formed in a same process.

Figure 24:
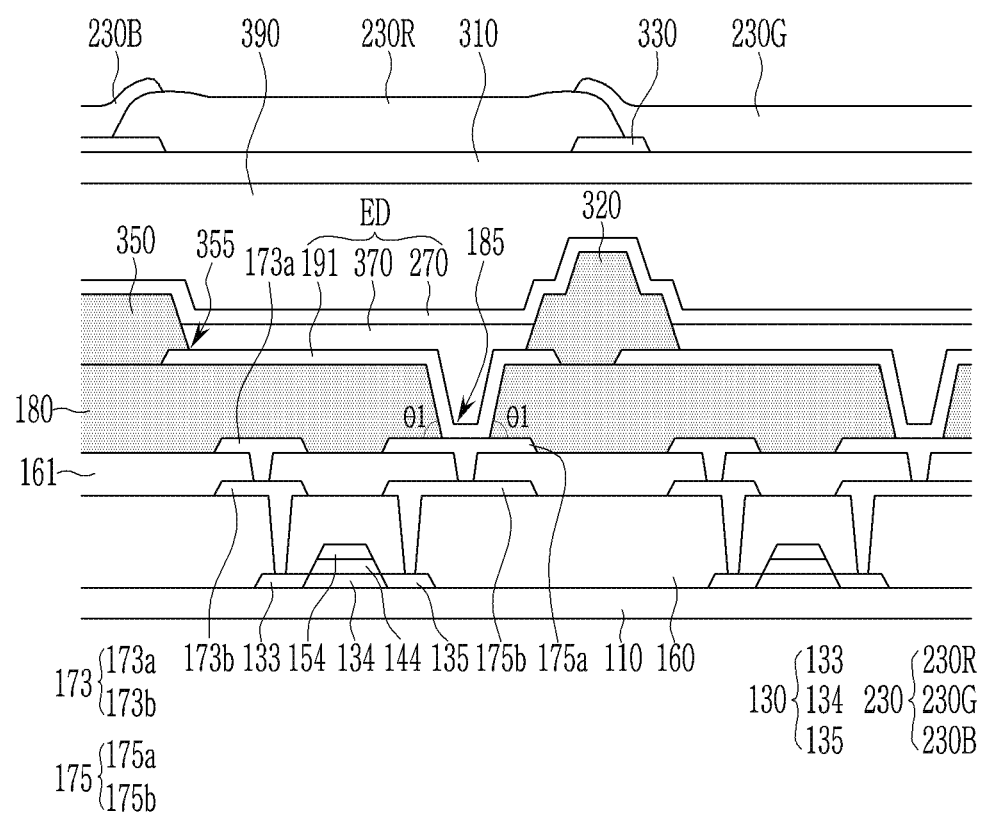
FIG. 24 schematically illustrates a cross-section of a display device according to another embodiment.

FIG. 24 schematically illustrates a cross-section of a display device according to another embodiment. Referring to FIG. 24, the display device according to an embodiment is identical to the display device of FIG. 19 except that the insulating layer 180, the partition wall 350, and the spacer 320 disposed on the partition wall 350 include a black material. A detailed description of the same elements will be omitted. In FIG. 24, a configuration in which all of the insulating layer 180, the partition wall 350, and the spacer 320 include a black material is illustrated, but in another embodiment only some of them may include a black material.

Figure 25:
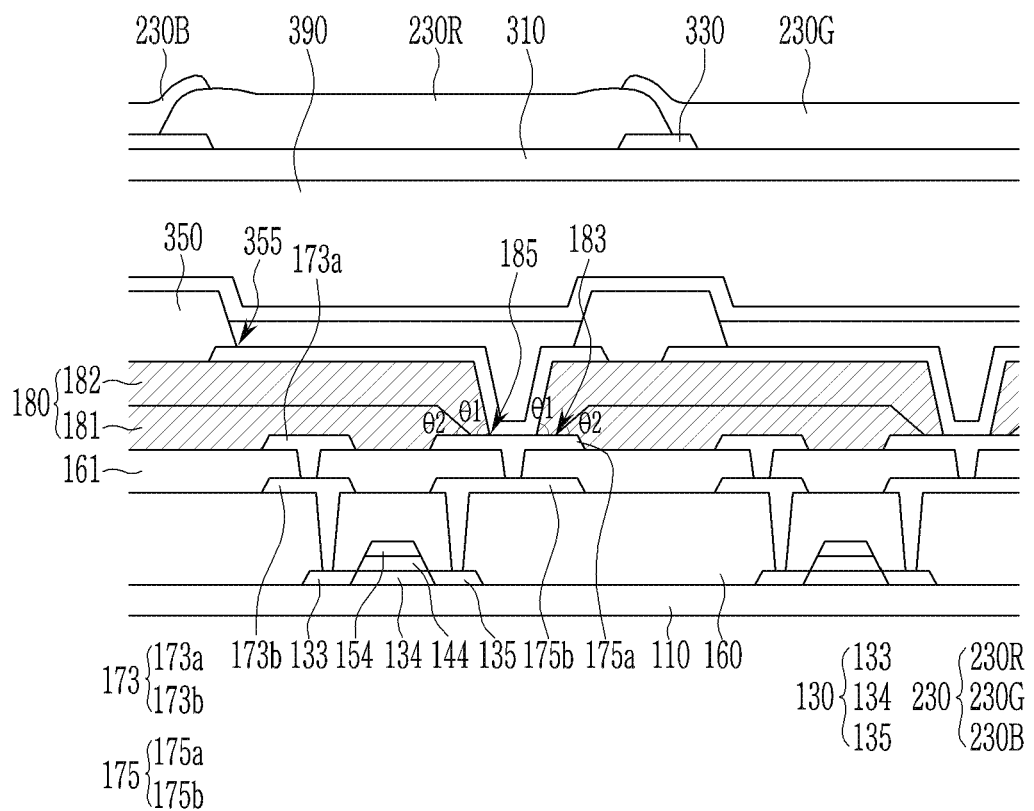
FIG. 25 schematically illustrates a cross-section of a display device according to another embodiment.

FIG. 25 illustrates a cross-section of a display device according to another embodiment. Referring to FIG. 25, in the display device according to an embodiment, the display device is identical to the display device of FIG. 4A except that the source electrode 173 includes a first source electrode 173a and a second source electrode 173b, and the drain electrode 175 includes a first drain electrode 175a and a second drain electrode 175b. A detailed description of the same elements will be omitted. Referring to FIG. 25, the intermediate layer 161 is disposed between the first source electrode 173a and the second source electrode 173b and between the first drain electrode 175a and the second drain electrode 175b. The first source electrode 173a and the second source electrode 173b are connected to each other through an opening of the intermediate layer 161, and the first drain electrode 175a and the second drain electrode 175b are connected to each other through an opening of the intermediate layer 161. Descriptions of the first insulating layer 181 and the second insulating layer 182 are the same as the descriptions with reference to FIG. 4A. For example, the angle θ2 of the side surface of the opening 183 of the first insulating layer 181 with respect to the plane may be different from the angle θ1 of the side surface of the opening 185 of the second insulating layer 182 with respect to the plane. The angle θ1 formed by the side surface of the opening 185 of the second insulating layer 182 with respect to the plane may be in a range of about 70 to about 85 degrees.

Figure 26:
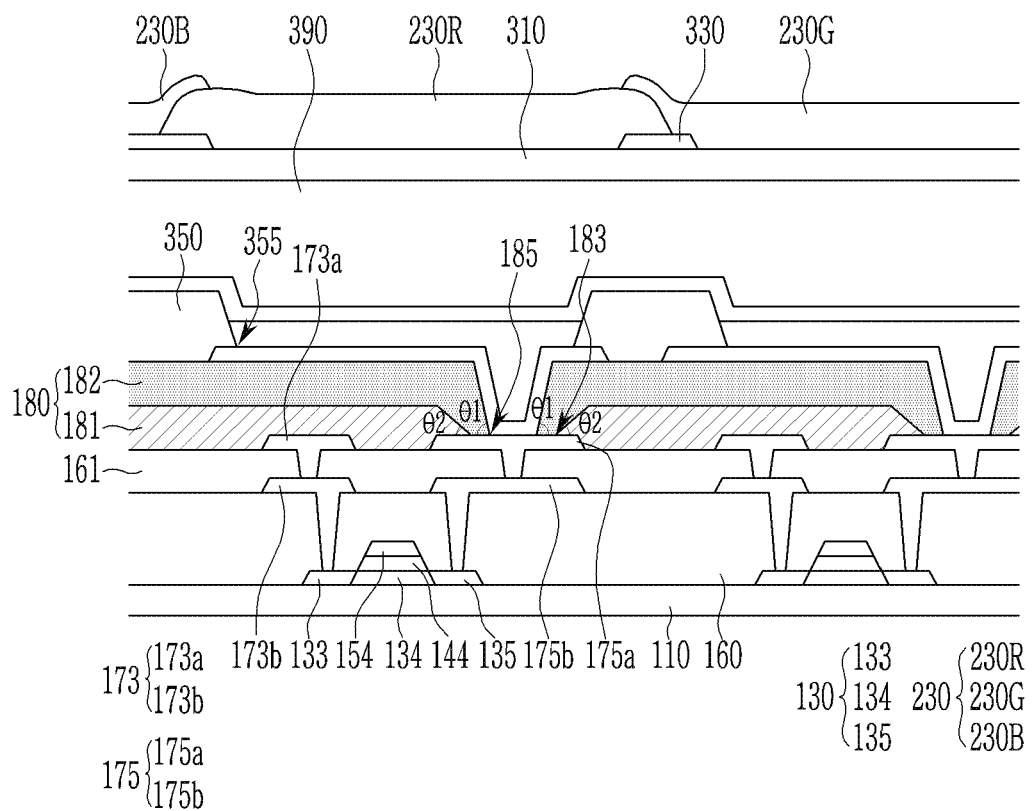
FIG. 26 schematically illustrates a cross-section of a display device according to another embodiment.

FIG. 26 schematically illustrates a cross-section of a display device according to another embodiment. Referring to FIG. 26, the display device according to an embodiment is identical to the display device of FIG. 25 except that the second insulating layer 182 includes a black material. The second insulating layer 182 may include carbon black or an organic black material and may have a black color. A detailed description of the same elements will be omitted.

Figure 27:
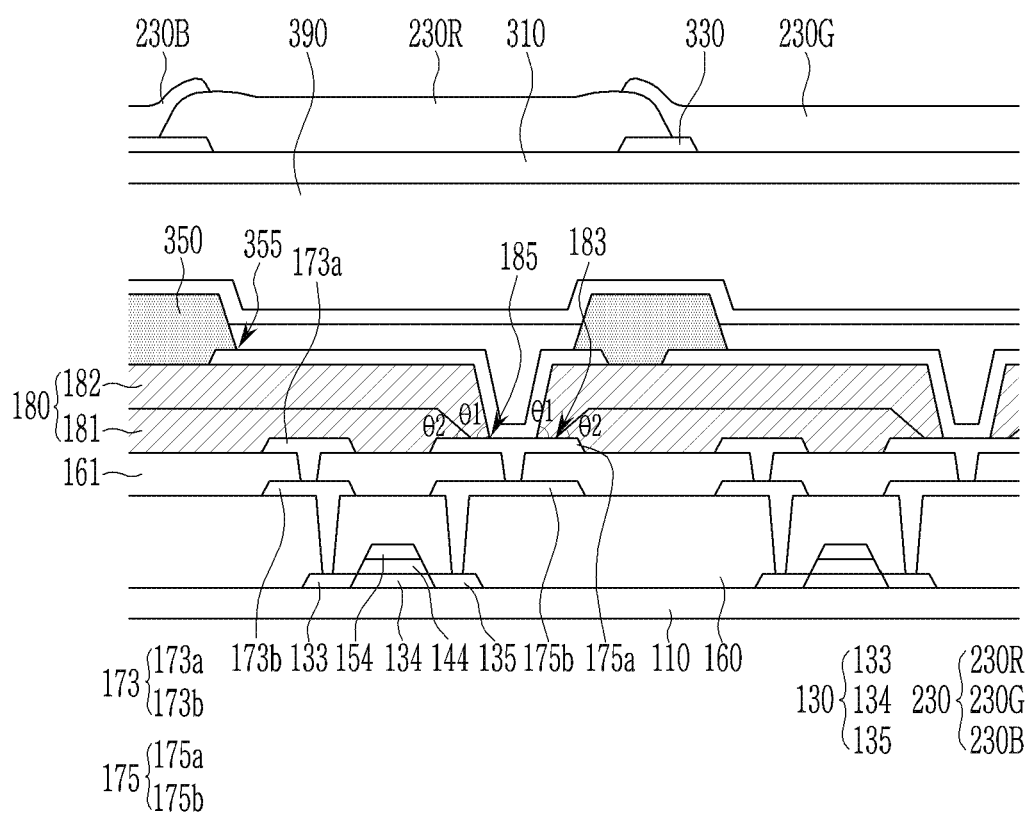
FIG. 27 schematically illustrates a cross-section of a display device according to another embodiment.

FIG. 27 schematically illustrates a cross-section of a display device according to another embodiment. Referring to FIG. 27, the display device according to an embodiment is identical to the display device of FIG. 25 except that the partition wall 350 includes a black material. The partition wall 350 may include carbon black or an organic black material and may have a black color.

Figure 28:
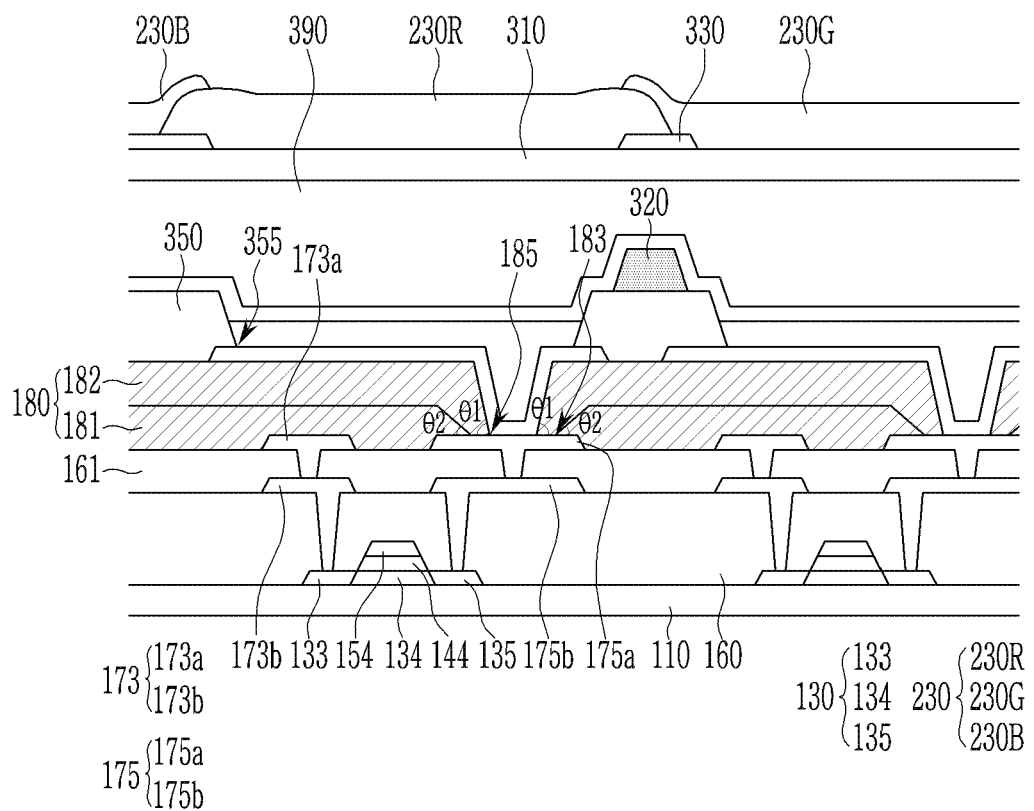
FIG. 28 schematically illustrates a cross-section of a display device according to another embodiment.

FIG. 28 schematically illustrates a cross-section of a display device according to another embodiment. The display device of FIG. 28 is identical to the display device of FIG. 25 except that the spacer 320 is disposed on the partition wall 350. Referring to FIG. 28, the spacer 320 may include a black material. For example, the spacer 320 may include carbon black or an organic black material and may have a black color.

Figure 29:
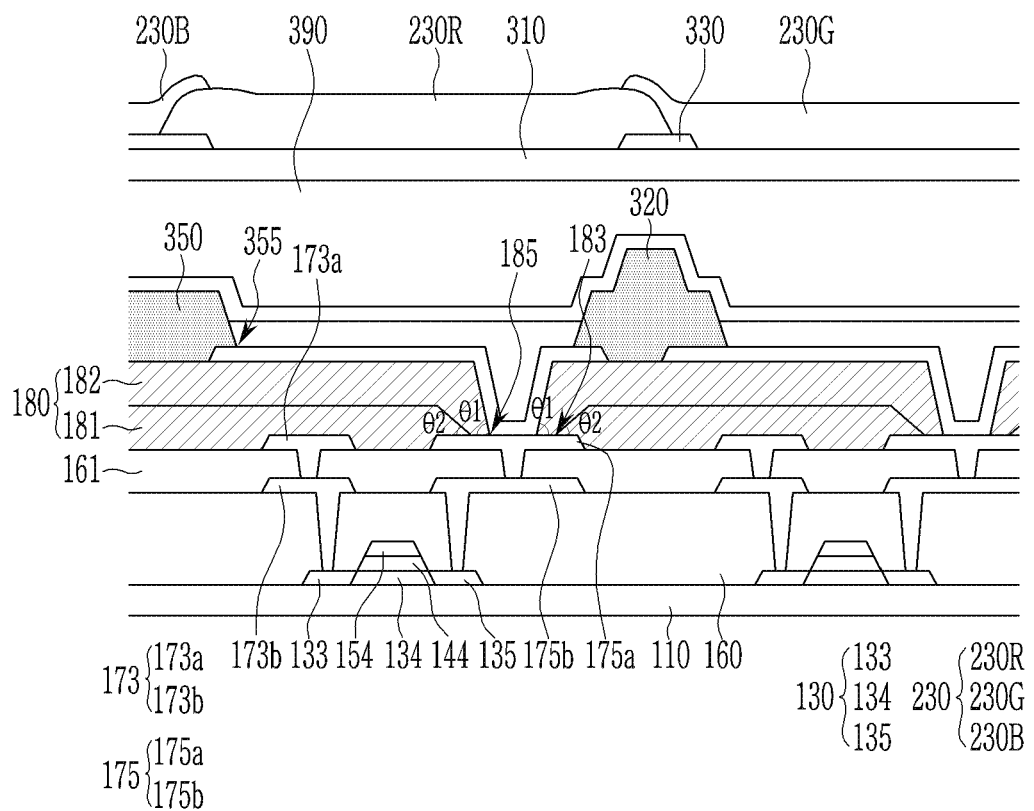
FIG. 29 schematically illustrates a cross-section of a display device according to another embodiment.

FIG. 29 schematically illustrates a cross-section of a display device according to another embodiment. The display device of FIG. 29 is identical to the display device of FIG. 28 except that the spacer 320 and the partition wall 350 are connected to each other and include a black material. A detailed description of the same elements will be omitted. In FIG. 29, the spacer 320 and the partition wall 350 may be formed in a same process.

Figure 30:
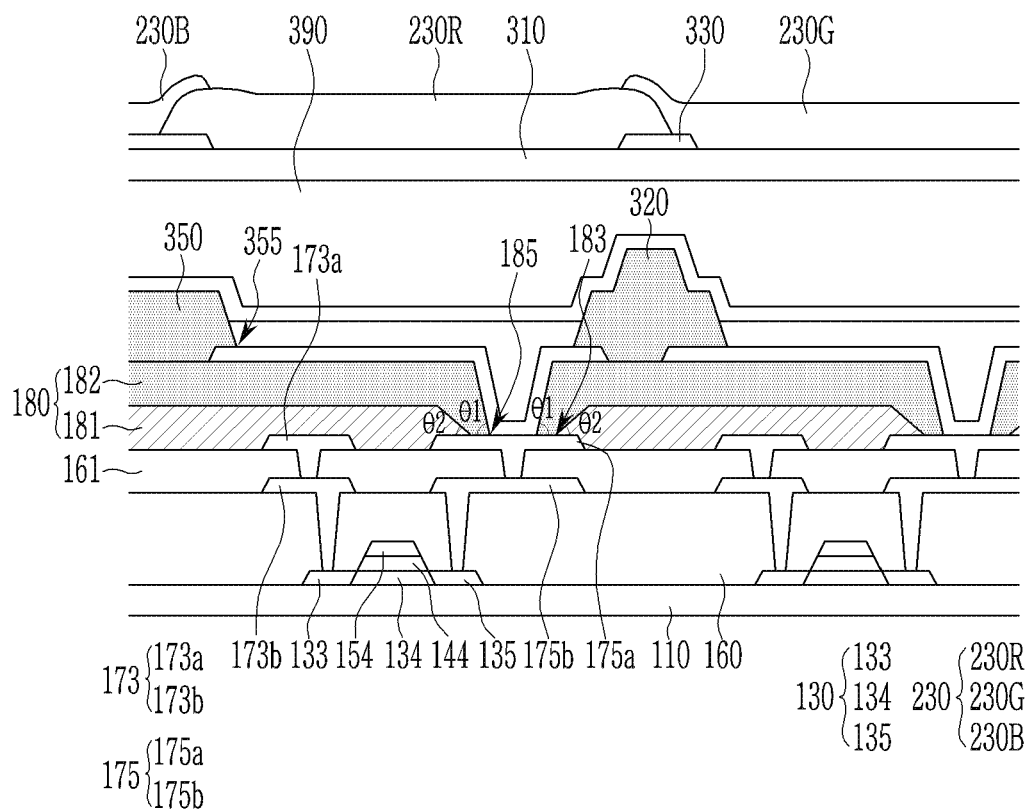
FIG. 30 schematically illustrates a cross-section of a display device according to another embodiment.

FIG. 30 schematically illustrates a cross-section of a display device according to another embodiment. Referring to FIG. 30, the display device according to an embodiment is identical to the display device of FIG. 25 except that the insulating layer 180, the partition wall 350, and the spacer 320 disposed on the partition wall 350 include a black material. A detailed description of the same elements will be omitted. In FIG. 30, a configuration in which all of the insulating layer 180, the partition wall 350, and the spacer 320 include a black material is illustrated, but in another embodiment only some of them may include a black material.

Figure 31:
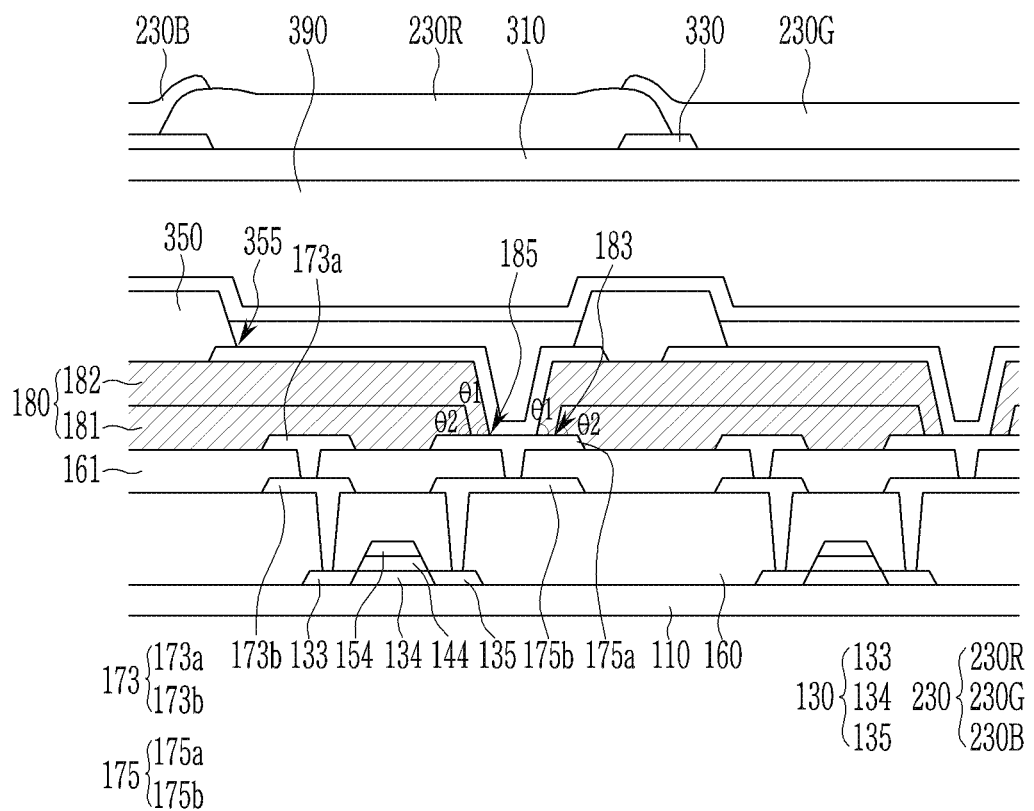
FIG. 31 schematically illustrates a cross-section of a display device according to another embodiment.

FIG. 31 schematically illustrates a cross-section of a display device according to another embodiment. Referring to FIG. 31, the display device according to the embodiment is identical to the display device of FIG. 5 except that the source electrode 173 includes a first source electrode 173a and a second source electrode 173b, and the drain electrode 175 includes a first drain electrode 175a and a second drain electrode 175b. A detailed description of the same elements will be omitted. Referring to FIG. 31, the intermediate layer 161 is disposed between the first source electrode 173a and the second source electrode 173b and between the first drain electrode 175a and the second drain electrode 175b. The first source electrode 173a and the second source electrode 173b are connected to each other in an opening of the intermediate layer 161, and the first drain electrode 175a and the second drain electrode 175b are connected to each other in an opening of the intermediate layer 161. Descriptions of the first insulating layer 181 and the second insulating layer 182 are the same as the descriptions with reference to FIG. 5. For example, the angle θ2 of the side surface of the opening 183 of the first insulating layer 181 with respect to the plane may be equal to the angle θ1 of the side surface of the opening 185 of the second insulating layer 182 with respect to the plane. For example, the angle θ2 and the angle θ1 may be in a range of about 70 degrees to about 85 degrees. Even in the embodiment of FIG. 31, the first insulating layer 181 or the second insulating layer 182 may include a black material.

Figure 32:
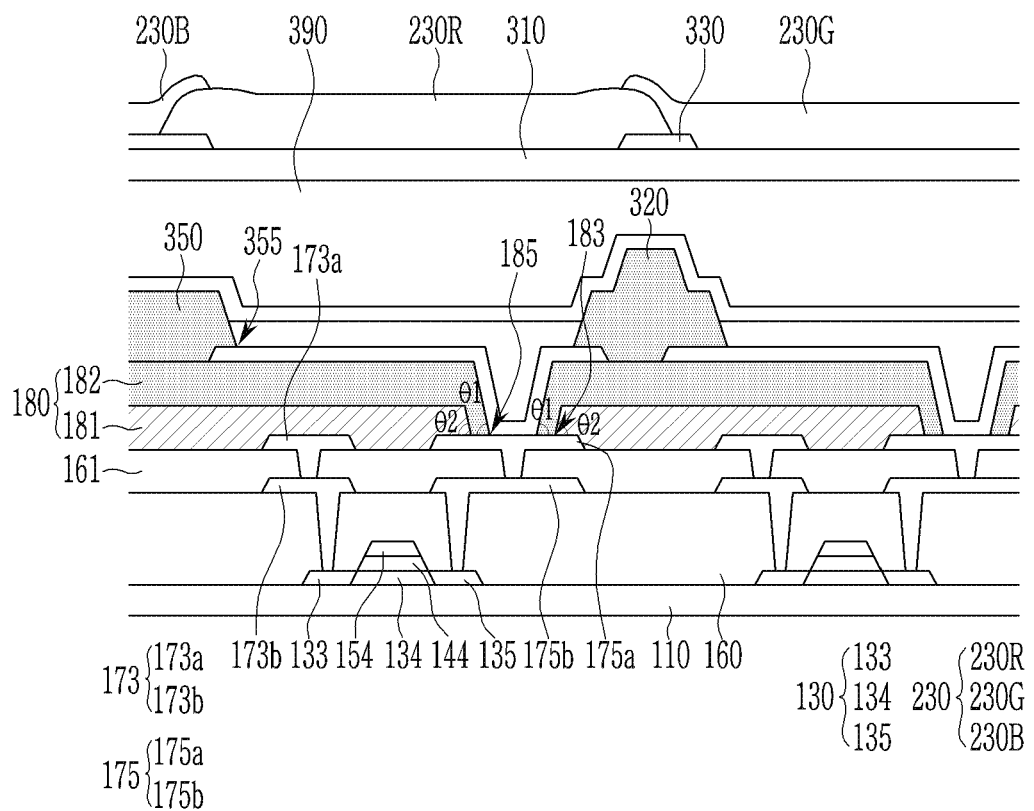
FIG. 32 schematically illustrates a cross-section of a display device according to another embodiment.

FIG. 32 schematically illustrates a cross-section of a display device according to another embodiment. Referring to FIG. 2, the display device according to an embodiment is identical to the display device of FIG. 31 except that the insulating layer 180, the partition wall 350, and the spacer 320 disposed on the partition wall 350 include a black material. A detailed description of the same elements will be omitted. In FIG. 32, there is illustrated a configuration in which all of the insulating layer 180, the partition wall 350, and the spacer 320 include a black material, but in another embodiment only some of them may include a black material.

Figure 33:
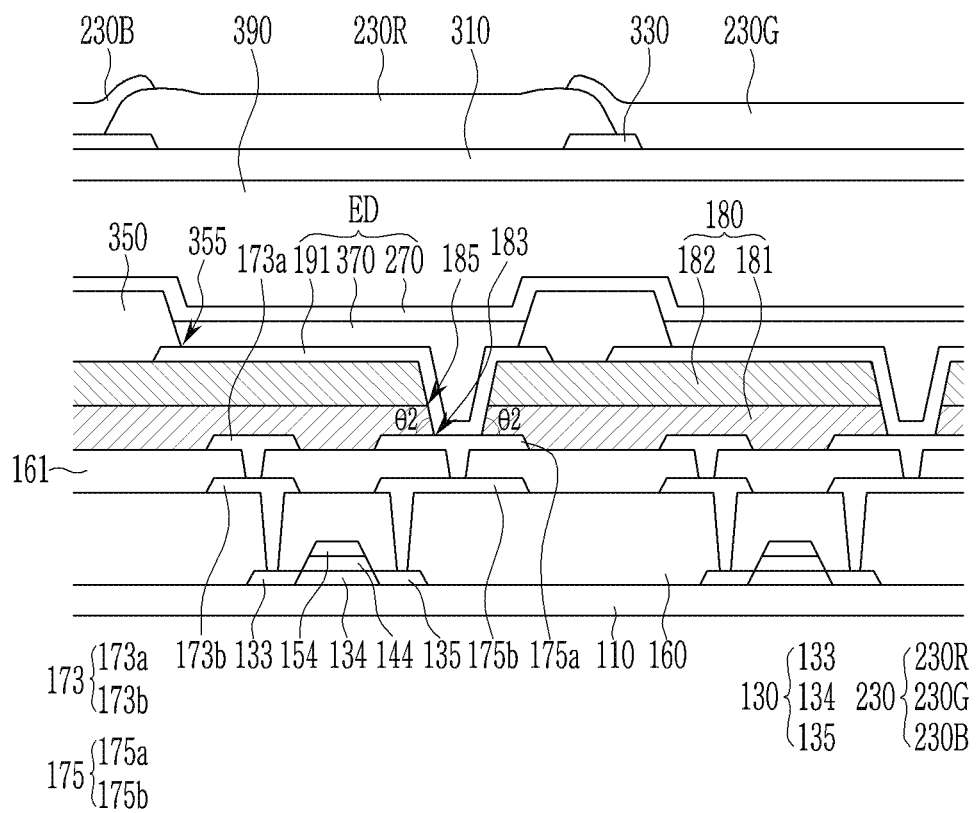
FIG. 33 schematically illustrates a cross-section of a display device according to another embodiment.

FIG. 33 schematically illustrates a cross-section of a display device according to another embodiment. Referring to FIG. 33, the display device according to an embodiment is identical to the display device of FIG. 6 except that the source electrode 173 includes a first source electrode 173a and a second source electrode 173b, and the drain electrode 175 includes a first drain electrode 175a and a second drain electrode 175b. A detailed description of the same elements will be omitted. Referring to FIG. 33, the intermediate layer 161 is disposed between the first source electrode 173a and the second source electrode 173b and between the first drain electrode 175a and the second drain electrode 175b. The first source electrode 173a and the second source electrode 173b are connected to each other in an opening of the intermediate layer 161, and the first drain electrode 175a and the second drain electrode 175b are connected to each other in an opening of the intermediate layer 161. Descriptions of the first insulating layer 181 and the second insulating layer 182 are the same as the descriptions with reference to FIG. 6. For example, the side surface of the opening 183 of the first insulating layer 181 and the side surface of the opening 185 of the second insulating layer 182 may be disposed on the same surface. In this case, the angle θ2 formed by the side surface of the opening 183 of the first insulating layer 181 with respect to the plane may be in a range of about 70 to about 85 degrees.

Figure 34:
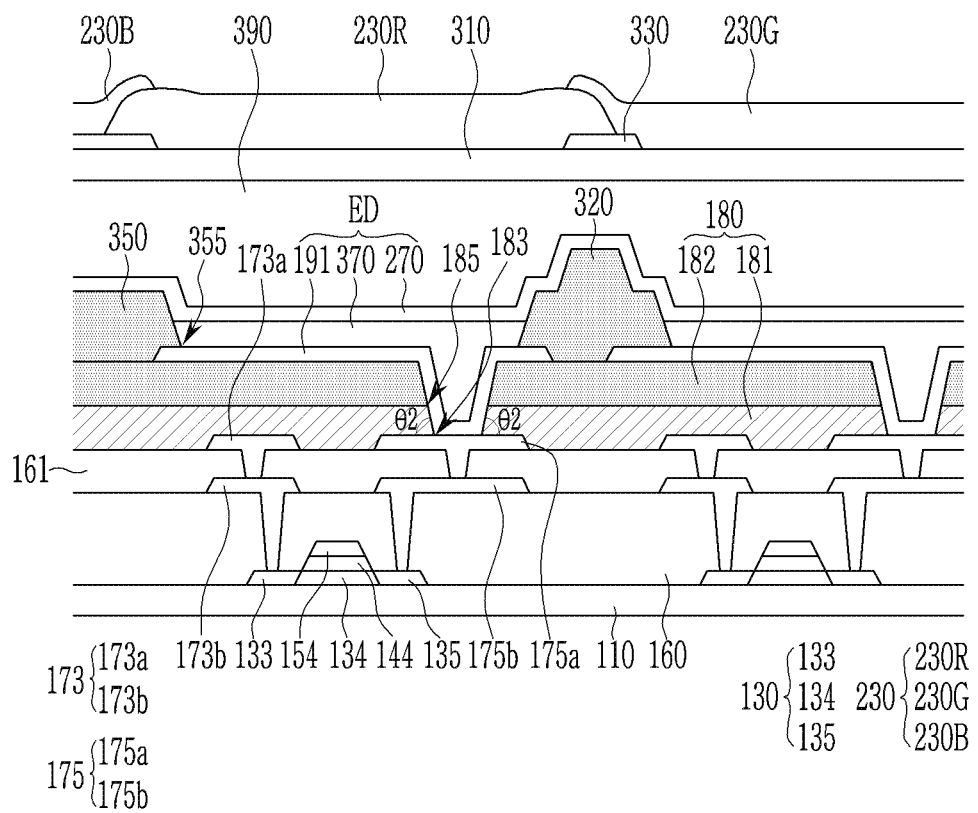
FIG. 34 schematically illustrates a cross-section of a display device according to another embodiment.

FIG. 34 schematically illustrates a cross-section of a display device according to another embodiment. Referring to FIG. 34, the display device according to an embodiment is identical to the display device of FIG. 33 except that the insulating layer 180, the partition wall 350, and the spacer 320 disposed on the partition wall 350 include a black material. A detailed description of the same elements will be omitted. In FIG. 34, there is illustrated a configuration in which all of the insulating layer 180, the partition wall 350, and the spacer 320 include a black material, but in another embodiment only some of them may include a black material.

Hereinafter, at least one manufacturing method of a display device according to an embodiment of the invention will be described in detail with reference to the drawings. The manufacturing process will be described with a focus on a manufacturing method of an insulating layer 180 including a first insulating layer 181 and a second insulating layer 182.

FIG. 35 to FIG. 40 schematically illustrate cross-sectional views illustrating a manufacturing process of a display device according to an embodiment of the invention. For better comprehension and ease of description, in FIG. 35 to FIG. 40, only the substrate 110, the source electrode 173, the drain electrode 175, the first insulating layer 181, the second insulating layer 182, the first electrode 191, the partition wall 350, and the spacer 320 are illustrated, and other elements are omitted. For example, the manufacturing method according to an embodiment has characteristics at least in a process of forming the first insulating layer 181 and the second insulating layer 182, which is mainly illustrated.

Figure 35:
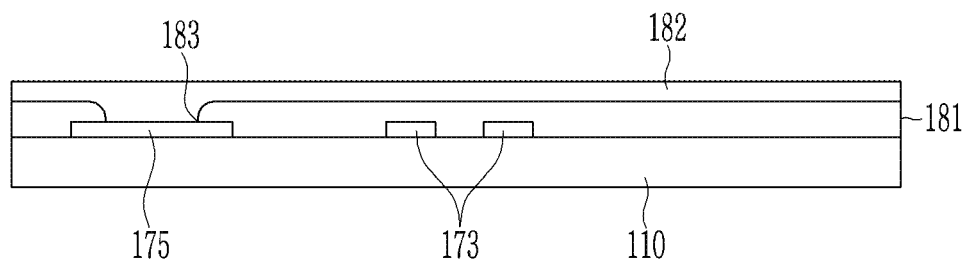
FIG. 35 to FIG. 40 schematically illustrate cross-sectional views illustrating a manufacturing process of a display device according to an embodiment of the invention.

Referring to FIG. 35, a source electrode 173 and a drain electrode 175 are disposed on the substrate 110. Illustration of other layers disposed between the substrate 110 and the source electrode 173 and drain electrode 175 is omitted. The first insulating layer 181 is formed to overlap the source electrode 173 and the drain electrode 175 and includes an opening 183 overlapping the drain electrode 175. A second insulating layer 182 is disposed on the opening 183 of the first insulating layer 181. The second insulating layer 182 is disposed to overlap a front surface of the first insulating layer 181 and a front surface of the opening 183. In an embodiment, the second insulating layer 182 may include a black material. To the configuration in which the second insulating layer 182 includes the black material, the descriptions with reference to FIG. 1 to FIG. 34 may apply.

Figure 36:
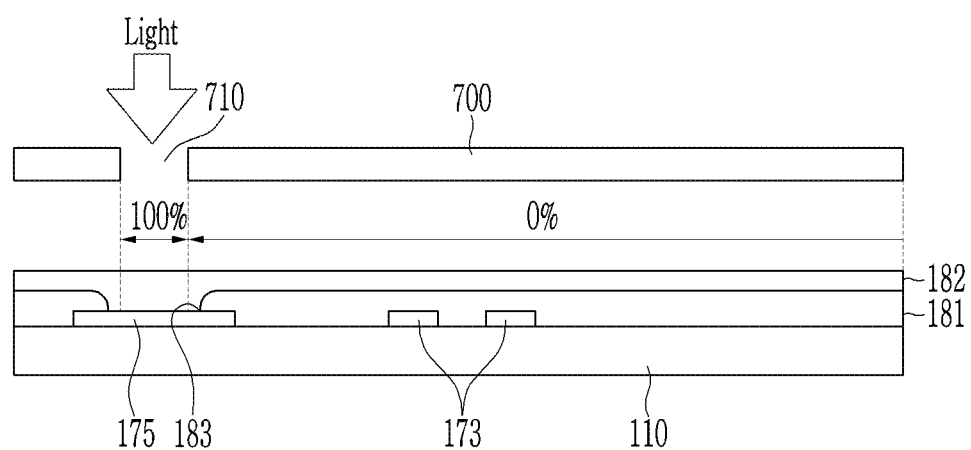

Next, referring to FIG. 36, a mask 700 is disposed on the second insulating layer 182. In this case, transmittance of the mask 700 in an opening 710 overlapping the drain electrode 175 may be about 100%, and the transmittance in the other regions may be about 0%. As such, the second insulating layer 182 is exposed through the mask 700.

Figure 37:
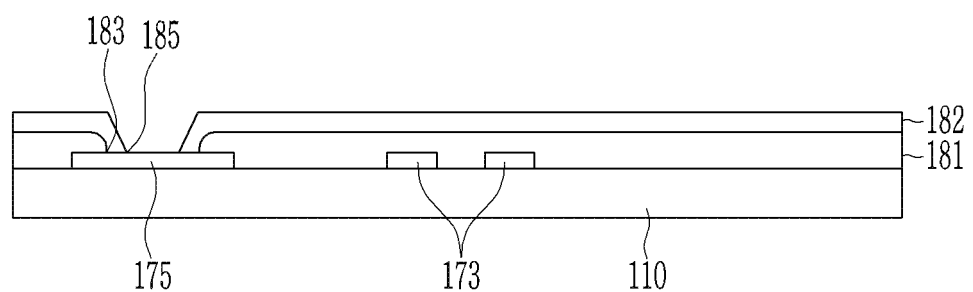

Next, referring to FIG. 37, the second insulating layer 182 exposed through the mask 700 is etched. The opening 185 overlapping the drain electrode 175 is formed in the second insulating layer 182 by etching, and an upper surface of the drain electrode 175 is exposed. Due to diffraction of light near the opening 710 of the mask 700, the opening 185 of the second insulating layer 182 may have a taper. In this case, the via hole angle of the opening 185 of the second insulating layer 182 may be similar to that of the opening 183 of the first insulating layer 181. This is because the opening 183 of the first insulating layer 181 is also etched by using the mask 700 having the opening 710.

Figure 38:
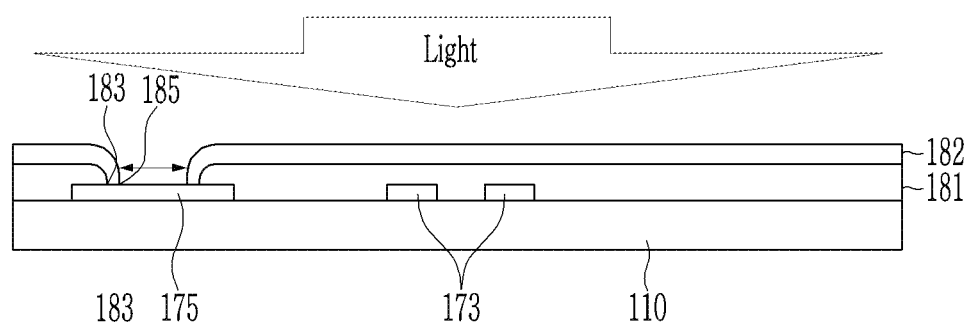

Next, referring to FIG. 38, exposure is performed on an entire surface of the second insulating layer 182. Photocuring occurs due to the exposure, and shrinkage of the second insulating layer 182 including the organic material occurs. During this shrinking process, a taper angle increases near the opening 185 of the second insulating layer 182. For example, as the second insulating layer 182 near the opening 185 contracts by photocuring, an angle between the side surface of the opening 185 and the plane of the opening 185 increases. In this case, the angle formed by the side surface of the opening 185 of the second insulating layer 182 with respect to the plane may be in a range of about 70 to about 85 degrees. At this time, the via hole angle of the opening 185 of the second insulating layer 182 may be controlled by adjusting an amount of time of the front exposure.

Figure 39:
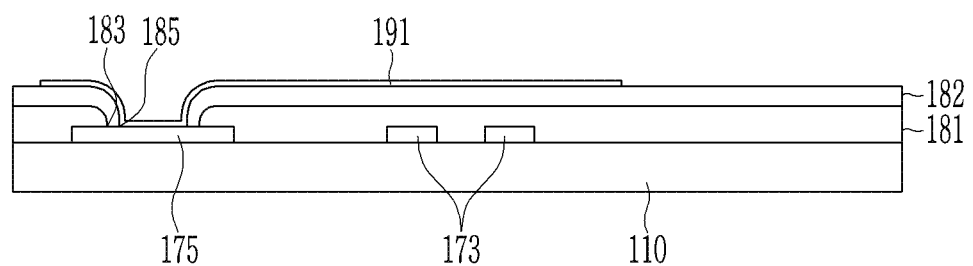

Next, referring to FIG. 39, the first electrode 191 is formed. The first electrode 191 is disposed along the upper and side surfaces of the second insulating layer 182 and directly contacts the drain electrode 175 in the opening 185 of the second insulating layer 182.

Figure 40:
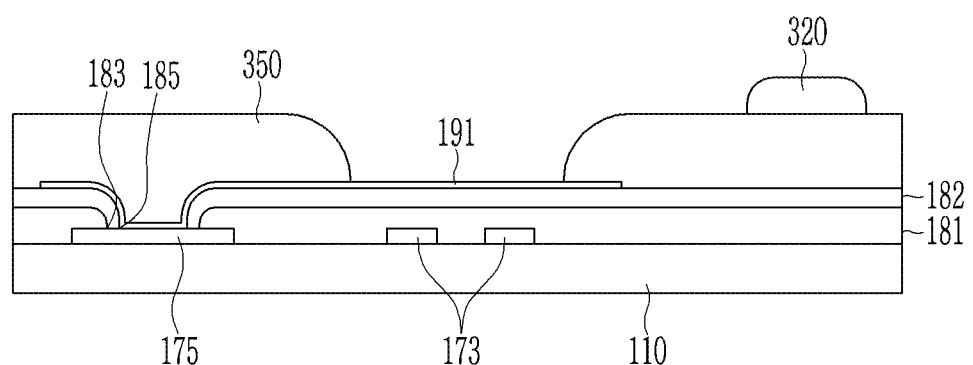

Next, referring to FIG. 40, the partition wall 350 is formed on the first electrode 191. The partition wall 350 has an opening overlapping the first electrode 191. In an embodiment, the partition wall 350 may include a black material. For the configuration in which the partition wall 350 includes the black material, the descriptions with reference to FIG. 1 to FIG. 34 may apply.

In a subsequent process, an emission layer or the like may be formed in the opening 185. A spacer 320 is formed on the partition wall 350. The spacer 320 may be disposed on a portion of the partition wall 350. In an embodiment, the spacer 320 may include a black material. To the configuration in which the spacer 320 includes the black material, the descriptions with reference to FIG. 1 to FIG. 34 may apply. The partition wall 350 and the spacer 320 may be formed by separate processes or may be formed simultaneously. In case that the partition wall 350 and the spacer 320 are formed in a single process, the partition wall 350 and the spacer 320 may include a black material. The descriptions with reference to FIG. 1 to FIG. 34 may apply to the configuration in which both the partition wall 350 and the spacer 320 include a black material.

Figure 41:
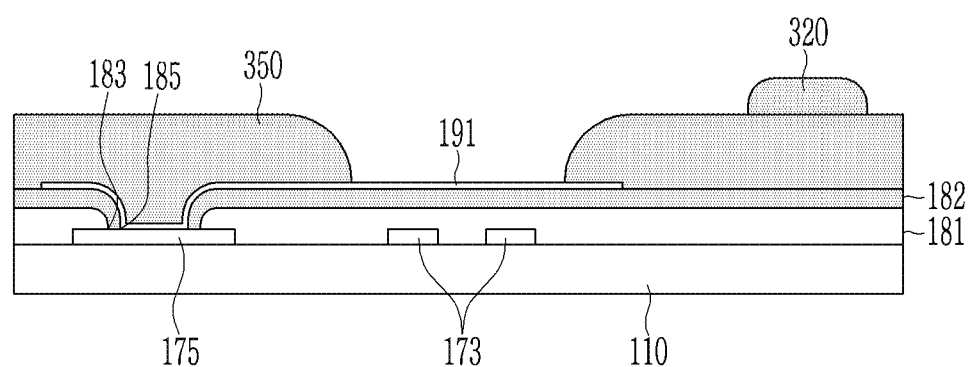
FIG. 41 schematically illustrates a cross-section of a display device according to an embodiment in which a second insulating layer, a partition wall, and a spacer include a black material in case that it is manufactured by using the manufacturing method of FIG. 35 to FIG. 40.

FIG. 41 schematically illustrates a cross-section of a display device according to an embodiment in which the second insulating layer 182, the partition wall 350, and the spacer 320 include a black material in case that it is manufactured by applying the manufacturing method of FIG. 35 to FIG. 40. Referring to FIG. 41, the second insulating layer 182, the partition wall 350, and the spacer 320 may include a black material. As described above, in accordance with the manufacturing method of the display device according to the embodiment of FIG. 35 to FIG. 41, the shrinking of the organic layer is caused by the performing of a front surface exposure process after the second insulating layer 182 is etched, thereby forming an opening having a taper angle of about 70 degrees to about 85 degrees.

In FIG. 35 to FIG. 41, the manufacturing method of an embodiment in which the insulating layer 180 includes the first insulating layer 181 and the second insulating layer 182 has been described, but the method can be used where the insulating layer 180 is a single layer. For example, an opening may be formed in the insulating layer 180 by exposure using the mask 700, and the via hole angle of the opening of the insulating layer 180 may be increased by entire exposure without using the mask 700.

A manufacturing method of a display device according to an embodiment will now be described with reference to FIG. 42 to FIG. 48. FIG. 42 to FIG. 48 schematically illustrate cross-sectional views illustrating a manufacturing process of a display device according to an embodiment of the invention. For better comprehension and ease of description, in FIG. 42 to FIG. 48, only the substrate 110, the source electrode 173, the drain electrode 175, the first insulating layer 181, the second insulating layer 182, the first electrode 191, and the partition wall 350 are illustrated, but the invention is limited thereto. For example, the manufacturing method according to an embodiment has characteristics at least in a process of forming the first insulating layer 181 and the second insulating layer 182, which is mainly illustrated.

Figure 42:
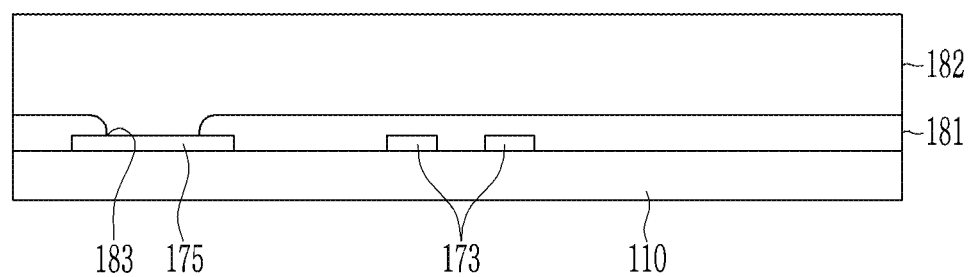
FIG. 42 to FIG. 48 schematically illustrate cross-sectional views illustrating a manufacturing process of a display device according to an embodiment of the invention.

Referring to FIG. 42, the source electrode 173, the drain electrode 175, and the first insulating layer 181 are disposed on the substrate 110. The first insulating layer 181 has an opening 183 overlapping the drain electrode 175. A second insulating layer 182 is disposed on the first insulating layer 181. The second insulating layer 182 is disposed to overlap a front surface of the first insulating layer 181 and a front surface of the opening 183. In this case, a thickness of the second insulating layer 182 may be thicker than a thickness of the second insulating layer 182 of FIG. 35 to FIG. 41. This is because the manufacturing method according to the embodiment is based on a structure in which a portion of the second insulating layer 182 functions as a spacer. In an embodiment, the second insulating layer 182 may include a black material. To the configuration in which the second insulating layer 182 includes the black material, the descriptions with reference to FIG. 1 to FIG. 34 may apply.

Figure 43:
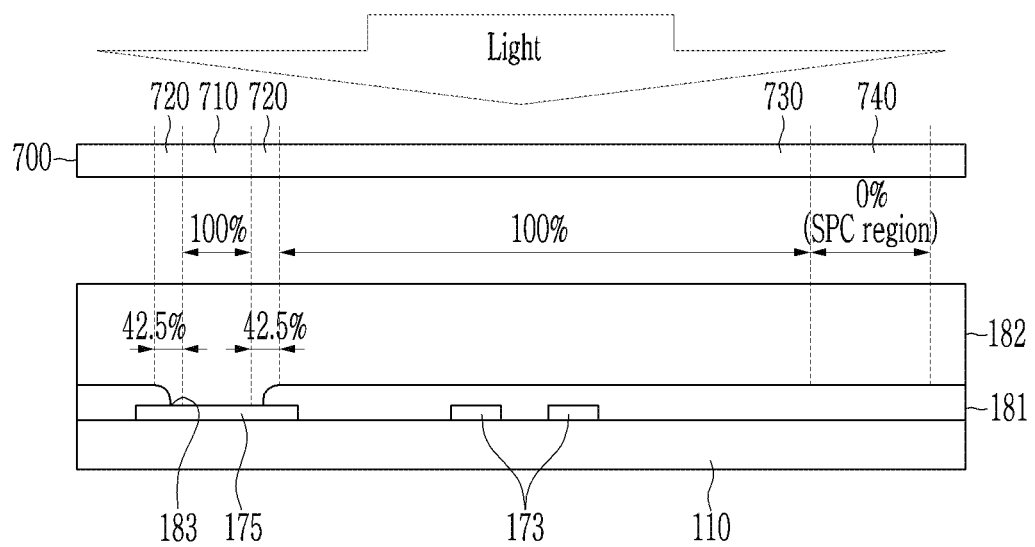

Next, referring to FIG. 43, the mask 700 is disposed on the second insulating layer 182 and is exposed. In this case, the mask 700 includes a first region 710, a second region 720, a third region 730, and a fourth region 740.

The first region 710 overlaps the opening 183 of the first insulating layer 181 and may have transmittance of about 100%. The second region 720 is disposed at opposite sides of the first region 710 to overlap a tapered region of the opening 183 of the first insulating layer 181 and may have transmittance of about 40% to about 50%. The third region 730 overlaps the second insulating layer 182 and may have transmittance of about 100%. The fourth region 740 is for forming a protrusion 187 of the second insulating layer 182, which functions as a spacer, and may have transmittance of about 0%.

Figure 44:
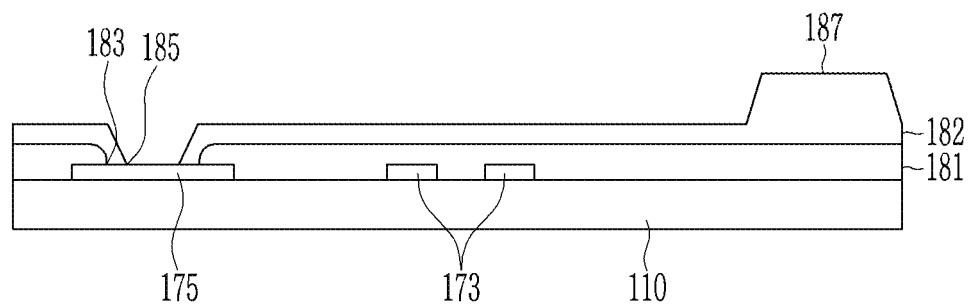

A structure illustrated in FIG. 44 may be formed by exposing and then etching the second insulating layer 182 with the mask 700 having such transmittance distribution.

Referring to FIG. 44, the second insulating layer 182 overlapping the third region 730 having transmittance of about 100% was etched from a thickness at a time of initial formation. For example, etching is performed until the second insulating layer 182 exposed to the third region 730 is not completely etched and partially remains.

In this case, the transmittance of the first region 710 is about 100%, which is equal to that of the third region 730, but as for the second insulating layer 182 exposed by the first region 710, light exposed through the neighboring second region 720 also affects it. It is exposed more than the second insulating layer 182 that is exposed by the third region 730. For example, the second insulating layer 182 overlapping the first region 710 is affected by both the first region 710 and the second region 720 of the mask 700 and completely etched. As a result, the opening 185 of the second insulating layer 182 may be formed.

In the case of the second insulating layer 182 overlapping the fourth region 740 of the mask 700, since the transmittance of the fourth region 740 is about 0%, it is hardly etched. As such, the second insulating layer 182 that was not etched forms the protrusion 187. However, a side surface of the protrusion 187 may be tapered by light incident on the adjacent third region 730.

Figure 45:
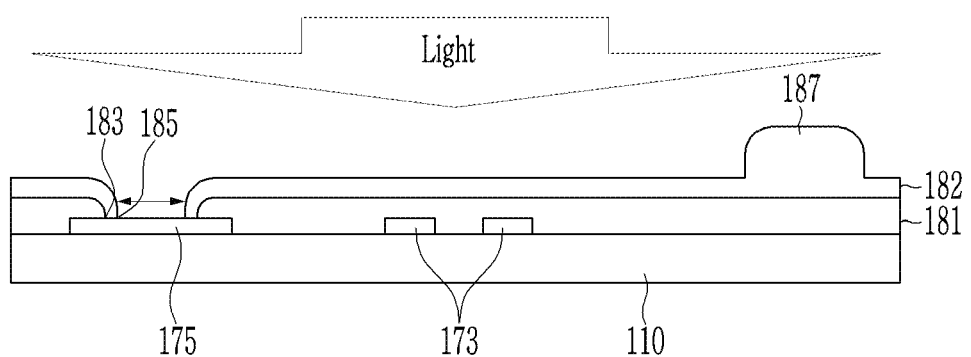

Next, referring to FIG. 45, exposure is performed on the entire surface of the second insulating layer 182. Photocuring occurs due to the exposure, and shrinkage of the second insulating layer 182 including the organic material occurs. During this shrinking process, a taper angle increases near the opening 185 of the second insulating layer 182. For example, as the second insulating layer 182 near the opening 185 contracts by photocuring, an angle between the side surface of the opening 185 and the plane of the opening 185 increases. In this case, the angle formed by the side surface of the opening 185 of the second insulating layer 182 with respect to the plane may be in a range of about 70 degrees to about 85 degrees. Similarly, the side surface of the protrusion 187 of the second insulating layer 182 may be contracted by photocuring, thereby increasing the angle formed by the side surface of the protruding portion 187 and the plane.

Figure 46:
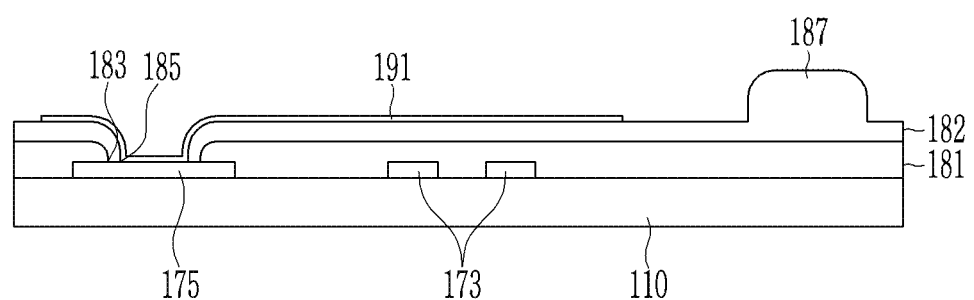

Referring to FIG. 46, the first electrode 191 is disposed on the second gate insulating layer 182. The first electrode 191 is disposed along the upper and side surfaces of the second insulating layer 182 and directly contacts the drain electrode 175 in the opening 185 of the second insulating layer 182.

Figure 47:
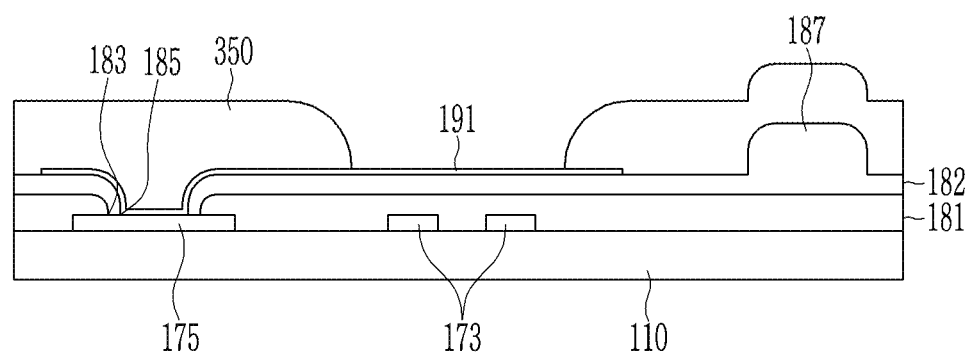

Next, referring to FIG. 47, the partition wall 350 is formed on the first electrode 191. The partition wall 350 has an opening overlapping the first electrode 191. The partition wall 350 is disposed on the protruding portion 187 of the second insulating layer 182, and the protrusion 187 of the second insulating layer 182 and the partition wall 350 on the protrusion 187 may function as spacers. Accordingly, a separate process of forming a spacer may be omitted.

Figure 48:
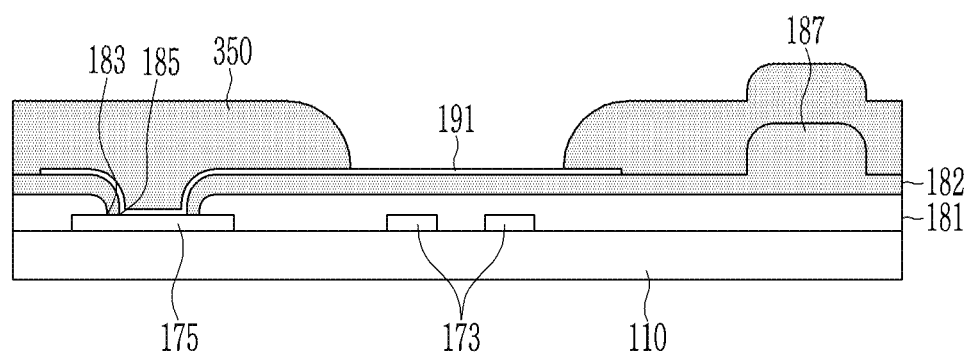

FIG. 48 schematically illustrates a cross-section of a display device according to an embodiment in which the second insulating layer 182, the partition wall 350, and the spacer 320 include a black material in case that it is manufactured by using the manufacturing method of FIG. 42 to FIG. 47. Referring to FIG. 48, the second insulating layer 182, the partition wall 350, and the spacer 320 may include a black material.

The manufacturing method of the display device according to the embodiment of the invention has been described above. Hereinafter, an example of a display device including the insulating layer 180 having a structure of an embodiment of the invention will be described in detail. However, the display described below is only an example, and the invention is not limited thereto. Regardless of a detailed structure of the other regions of the display device, if the via hole angle of the opening of the insulating layer in which the drain electrode and the first electrode are electrically connected to each other is about 70 degrees to about 85 degrees, they are all included in the embodiments of the invention.

Figure 49:
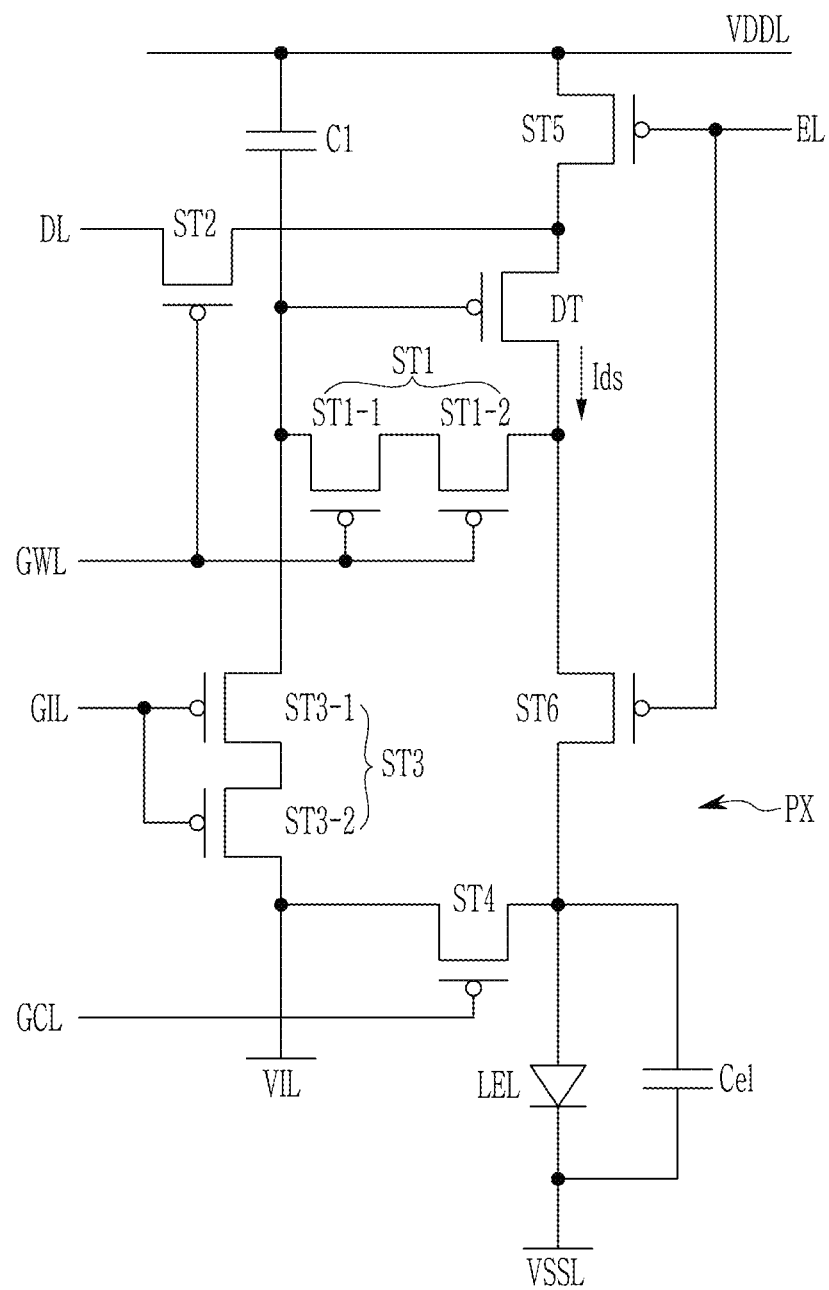
FIG. 49 and FIG. 50 schematically illustrate circuit diagrams illustrating a pixel according to embodiments of the invention, respectively.
Figure 50:
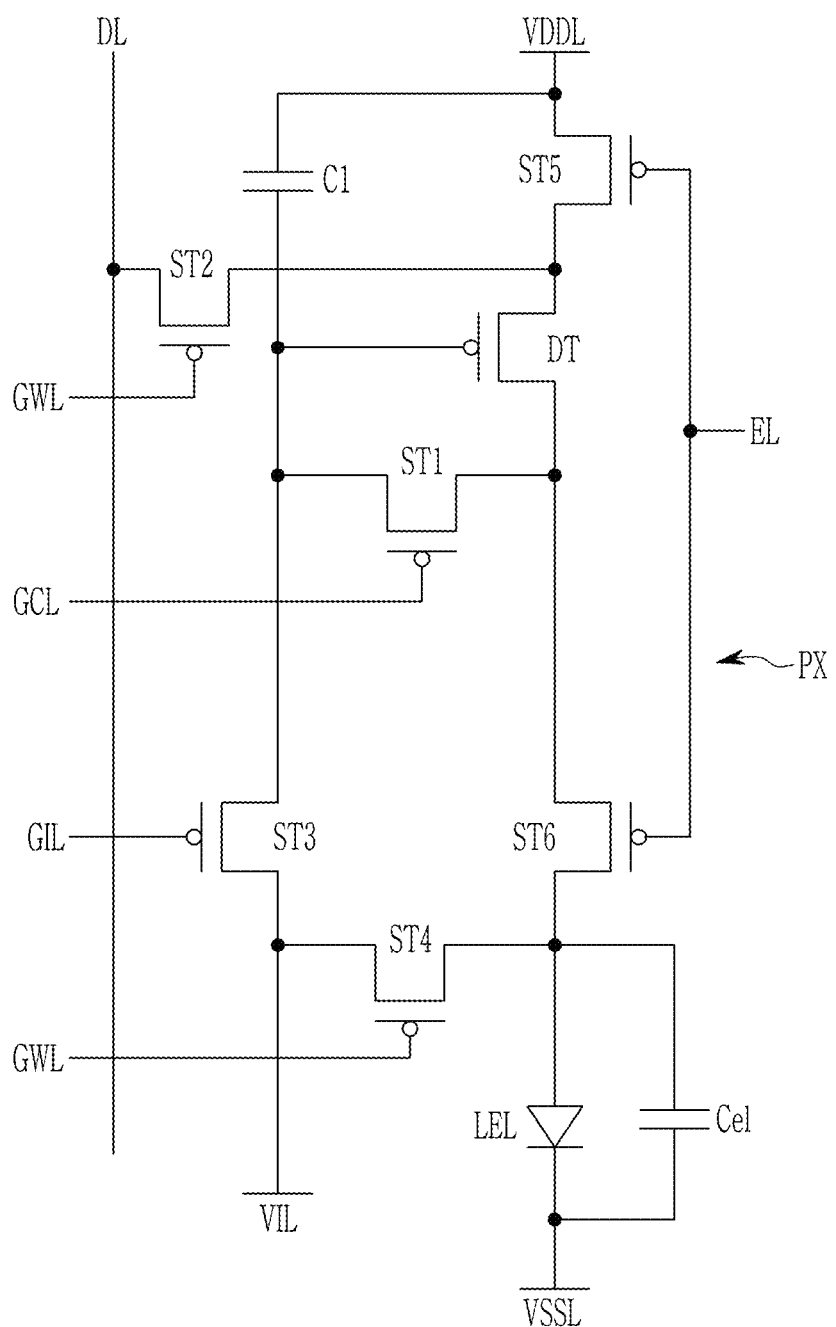

A pixel of the display device to which the invention can be applied will be briefly described below. FIG. 49 and FIG. 50 schematically illustrate circuit diagrams showing an example of a pixel according to an embodiment.

Referring to FIG. 49, each pixel PX may be electrically connected to any two of scan wires GWL, GIL, and GCL, one of emission wires EL, and one of data wires DL. For example, as illustrated in FIG. 49, the pixel PX includes a driving transistor DT, a light emitting element LEL, switch elements, and a capacitor C1. The switch elements include first to sixth transistors ST1, ST2, ST3, ST4, ST5, and ST6. The driving transistor DT includes a gate electrode, a first electrode, and a second electrode. The driving transistor DT controls a drain-source current Ids (hereinafter referred to as a "driving current") flowing between the first electrode and the second electrode according to a data voltage applied to the gate electrode.

The light emitting element LEL emits light according to the driving current Ids. An emission amount of the light emitting element LEL may be proportional to the driving current Ids.

The light emitting element LEL may be an organic light emitting diode including an anode, a cathode, and an organic emission layer disposed between the anode and the cathode. As another example, the light emitting element LEL may be an inorganic light emitting element including an anode, a cathode, and an inorganic semiconductor disposed between the anode and the cathode. As another example, the light emitting element LEL may be a quantum dot light emitting element including an anode, a cathode, and a quantum dot emission layer disposed between the anode and the cathode. As another example, the light emitting element LEL may be a micro-light-emitting diode.

The anode electrode of the light emitting element LEL may be electrically connected to a first electrode of the fourth transistor ST4 and a second electrode of the sixth transistor ST6, and the cathode electrode of the light emitting element LEL may be electrically connected to a third driving voltage wire VSSL. A parasitic capacitor Cel may be formed between the anode and the cathode of the light emitting element LEL.

The capacitor C1 is formed between a gate electrode of the driving transistor DT and a first driving voltage wire VDDL. A first electrode of the capacitor C1 may be electrically connected to the gate electrode of the driving transistor DT, and a second electrode of the capacitor C1 may be electrically connected to the first driving voltage wire VDDL.

In case that a first electrode of each of the first to sixth transistors ST1, ST2, ST3, ST4, ST5, and ST6 is a source electrode, the second electrode may be a drain electrode. As another example, in case that a first electrode of each of the first to sixth transistors ST1, ST2, ST3, ST4, ST5, and ST6 is a drain electrode, the second electrode may be a source electrode.

The active layers of each of the first to sixth transistors ST1, ST2, ST3, ST4, ST5, and ST6 may be formed of one of polysilicon, amorphous silicon, and an oxide semiconductor. In case that the semiconductor layer of each of the first to sixth transistors ST1, ST2, ST3, ST4, ST5, and ST6, and the driving transistor DT are formed of polysilicon, a process for forming it may be a low temperature polysilicon (LTPS) process.

In FIG. 49, the first to sixth transistors ST1, ST2, ST3, ST4, ST5, and ST6 and the driving transistor DT are mainly described as being P-type metal oxide semiconductor field effect transistors (MOSFET), but the invention is not limited thereto, and they may be N-type MOSFETs. The first transistor ST1 may include two transistors ST1-1 and ST1-2, and the third transistor ST3 may include two transistors ST3-1 and ST3-2.

The first driving voltage of the first driving voltage wire VDDL, a second driving voltage of a second driving voltage wire VIL, and a third driving voltage of the third driving voltage wire VSSL may be set based on characteristics of the driving transistor DT, characteristics of the light emitting element LEL, and the like.

FIG. 50 illustrates a schematic circuit diagram showing another example of the pixel of the invention.

The embodiment of FIG. 50 is different from the embodiment of FIG. 49 at least in that the driving transistor DT, the second transistor ST2, the fourth transistor ST4, the fifth transistor ST5, and the sixth transistor ST6 are P-type MOSFETs, and the first transistor ST1 and the third transistor ST3 may are N-type MOSFETs.

Referring to FIG. 50, active layers of the driving transistor DT, the second transistor ST2, the fourth transistor ST4, the fifth transistor ST5, and the sixth transistor ST6, which are the P-type MOSFETs, are formed of polysilicon, whereas active layers of the first transistor ST1 and the third transistor ST3, which are the N-type MOSFETs, may be formed of an oxide semiconductor. In this case, since the transistors formed of polysilicon and the transistors formed of an oxide semiconductor may be disposed on different layers, an area of the pixel PX may be reduced.

In FIG. 50, a gate electrode of the second transistor ST2 and a gate electrode of the fourth transistor ST4 are electrically connected to a writing scan wire GWL, and a gate electrode of the first transistor ST1 is electrically connected to the control scan wire GCL, which is different from the embodiment of FIG. 49. In FIG. 50, the first transistor ST1 and the third transistor ST3 are N-type MOSFETs, and thus a scan signal of a gate high voltage may be applied to the control scan wire GCL and an initialization scan wire GIL. Since the second transistor ST2, the fourth transistor ST4, the fifth transistor ST5, and the sixth transistor ST6 are P-type MOSFETs, a scan signal of a gate low voltage may be applied to the writing scan wire GWL and the emission wire EL.

The embodiments of FIG. 1 to FIG. 34 described above may be applied to a display device having the circuit diagram of FIG. 49 or FIG. 50. However, this is only an example, and the invention is not limited thereto.

While this invention has been described in connection with what is presently considered to be practical embodiments, it is to be understood that the disclosure is not limited to the disclosed embodiments and is intended to cover various modifications and equivalent arrangements included within the spirit and scope of the appended claims.

What is claimed is:

1. A display device comprising:
   a source electrode or a drain electrode disposed on a substrate;
   a first insulating layer disposed on the source electrode or the drain electrode, the first insulating layer including a first opening overlapping the drain electrode;
   a second insulating layer overlapping an upper surface of the first insulating layer and a side surface of the first opening, the second insulating layer including a second opening overlapping the drain electrode; and
   a first electrode disposed on the second insulating layer and electrically contacting a source electrode or the drain electrode in the second opening of the second insulating layer, wherein
   an angle between a side surface of the second opening of the second insulating layer and a plane parallel to the substrate is in a range of about 70 degrees to about 85 degrees.

2. The display device of claim 1, wherein an angle between a side surface of the first opening of the first insulating layer and the plane parallel to the substrate and the angle between the side surface of the second opening of the second insulating layer and the plane parallel to the substrate are equal to each other.

3. The display device of claim 1, wherein an angle between a side surface of the first opening of the first insulating layer and the plane parallel to the substrate and the angle between the side surface of the second opening of the second insulating layer and the plane parallel to the substrate are different from each other.

4. The display device of claim 3, wherein the angle between the side surface of the first opening of the first insulating layer and the plane parallel to the substrate is smaller than the angle between the side surface of the second opening of the second insulating layer and the plane parallel to the substrate.

5. The display device of claim 1, wherein an angle between a side surface of the first opening of the first insulating layer and the plane parallel to the substrate is equal to or less than about 45 degrees.

6. The display device of claim 1, wherein each of a thickness of the first insulating layer and a thickness of the second insulating layer are in a range of about 1.5 μm to about 3.0 μm.

7. The display device of claim 1, wherein the first insulating layer and the second insulating layer include different materials.

8. The display device of claim 1, wherein
the first insulating layer includes a siloxane or a polyimide, and
the second insulating layer includes a siloxane or a polyimide.

9. The display device of claim 1, wherein
the source electrode includes a first source electrode and a second source electrode electrically connected to each other; or
the drain electrode includes a first drain electrode and a second drain electrode electrically connected to each other, and
the display device further comprises an intermediate layer disposed between the first source electrode and the second source electrode or the first drain electrode and the second drain electrode.

10. The display device of claim 1, further comprising:
a partition wall disposed on the first electrode; and
a spacer disposed on the partition wall,
wherein at least one of the partition wall, the spacer, and the second insulating layer includes a black material.

11. The display device of claim 1, wherein the side surface of the first opening of the first insulating layer and the side surface of the second opening of the second insulating layer are disposed on a same surface.

12. The display device of claim 10, wherein an angle between a side surface of the first opening of the first insulating layer and the plane parallel to the substrate is in a range of about 70 degrees to about 85 degrees.

13. The display device of claim 10, wherein a side surface of the first insulating layer and a side surface of the first electrode directly contact each other.

* * * * *